United States Patent
Zhang et al.

(10) Patent No.: US 11,962,174 B2
(45) Date of Patent: Apr. 16, 2024

(54) PROTECTION CIRCUIT AND BATTERY MANAGEMENT SYSTEM

(71) Applicant: CONTEMPORARY AMPEREX TECHNOLOGY CO., LIMITED, Ningde (CN)

(72) Inventors: Wei Zhang, Ningde (CN); Zhimin Dan, Ningde (CN); Jinbo Cai, Ningde (CN); Yizhen Hou, Ningde (CN); Meilin Chen, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 397 days.

(21) Appl. No.: 17/122,955

(22) Filed: Dec. 15, 2020

(65) Prior Publication Data

US 2021/0104903 A1    Apr. 8, 2021

Related U.S. Application Data

(63) Continuation of application No. PCT/CN2019/127599, filed on Dec. 23, 2019.

(30) Foreign Application Priority Data

Dec. 24, 2018    (CN) .......................... 201811585104.8

(51) Int. Cl.
*H02J 7/00*    (2006.01)

(52) U.S. Cl.
CPC ........ *H02J 7/00304* (2020.01); *H02J 7/0068* (2013.01)

(58) Field of Classification Search
CPC .. H02J 7/00304; H02J 7/0068; H02J 7/00308; H03K 2217/0054;

(Continued)

(56) References Cited

U.S. PATENT DOCUMENTS 7,365,952 B2 * 4/2008 Sato ..................... H02J 7/00304
                                                                320/122
8,638,531 B2 * 1/2014 Bhavaraju ............ H01H 50/045
                                                                361/8

(Continued)

FOREIGN PATENT DOCUMENTS

CN        101018015 A      8/2007
CN        101594053 A      12/2009

(Continued)

OTHER PUBLICATIONS

Contemporary Amperex Technology Co. Limited, International Search Report and Written Opinion, PCTCN2019127599, dated Mar. 12, 2020, 12 pgs.

(Continued)

*Primary Examiner* — Nghia M Doan
(74) *Attorney, Agent, or Firm* — Kilpatrick Townsend & Stockton LLP

(57) ABSTRACT

This application discloses a protection circuit associated with a battery management system (BMS). The protection circuit includes a first protection module and a freewheeling module. The first protection module is connected in parallel to a first switch module of the BMS, and the freewheeling module is connected in parallel to a load module of the BMS. The first protection module switches to a charging state when the first switch module is turned off to stabilize a voltage between a first terminal of the first switch module and a second terminal of the first switch module. The freewheeling module is turned on when the first switch module is turned off to stabilize a voltage between the first switch module and the second switch module. The protection circuit mitigates risks of breakdown of the first switch module, and prevents a parasitic inductance from limiting a switching frequency of the first switch module.

18 Claims, 18 Drawing Sheets

(58) Field of Classification Search
CPC ...... H03K 17/0822; H02H 9/04; H02H 7/008; H02H 9/045; H02H 3/10; H02H 9/02
See application file for complete search history.

(56) References Cited

U.S. PATENT DOCUMENTS

| | | | |
|---|---|---|---|
| 9,118,177 B2* | 8/2015 | Shipley | H02H 3/22 |
| 9,917,451 B2 | 3/2018 | Kim | |
| 10,033,205 B2* | 7/2018 | Li | H02J 7/00304 |
| 2003/0183838 A1* | 10/2003 | Huang | H03K 17/08148 257/107 |
| 2006/0072259 A1 | 4/2006 | Yunus | |
| 2019/0359061 A1 | 11/2019 | Dan et al. | |

FOREIGN PATENT DOCUMENTS

| | | |
|---|---|---|
| CN | 101911420 A | 12/2010 |
| CN | 102097796 A | 6/2011 |
| CN | 103199505 A | 7/2013 |
| CN | 205791646 U | 12/2016 |
| CN | 107276571 A | 10/2017 |
| CN | 107791844 A | 3/2018 |
| CN | 108705943 A | 10/2018 |
| CN | 108879027 A | 11/2018 |
| CN | 108964449 A | 12/2018 |
| EP | 3573173 A2 | 11/2019 |

OTHER PUBLICATIONS

Contemporary Amperex Technology Co. Limited, Extended European Search Report, EP19904375.3, dated Sep. 3, 2021, 8 pgs.
Ningder Age New Energy Technology Co., Ltd., First Office Action, CN201811585104.8, dated Jul. 28, 2020, 21 pgs.
Ningder Age New Energy Technology Co., Ltd., Third Office Action, CN201811585104.8, dated Jan. 13, 2021, 15 pgs.

* cited by examiner

PROTECTION CIRCUIT AND BATTERY MANAGEMENT SYSTEM

CROSS-REFERENCE TO RELATED APPLICATIONS

This application is a continuation application of PCT Patent Application No. PCT/CN2019/127599, entitled "PROTECTION CIRCUIT AND BATTERY MANAGEMENT SYSTEM" filed on Dec. 23, 2019, which claims priority to Chinese Patent Application No. 201811585104.8, filed with the State Intellectual Property Office of the People's Republic of China on Dec. 24, 2018, and entitled "PROTECTION CIRCUIT AND BATTERY MANAGEMENT SYSTEM", all of which are incorporated herein by reference in their entirety.

TECHNICAL FIELD

This application relates to the technical field of integrated circuits, and in particular, to a protection circuit and a battery management system (BMS).

BACKGROUND

Currently, as an important part of the new energy field, electric vehicles are growing rapidly. Due to advantages such as cost-effectiveness and low on-resistance, relays have been dominantly applied to electric vehicles. However, due to disadvantages such as heavy weight, low switching speed, and high failure rate of the relays, semiconductor power devices have been valued and applied in the electric vehicles. For example, an insulated gate bipolar transistor (IGBT) and a metal oxide semiconductor field-effect transistor (MOSFET) have been applied to motors and inverters. Compared with mechanical relays, semiconductor power devices are simple to install and compatible with a BMS, and have a longer life cycle than an automotive life cycle when properly protected.

SUMMARY

An objective of some embodiments of this application is to disclose a protection circuit and a BMS to stabilize a voltage between two terminals of a first switch module in the BMS, reduce risks of breakdown of the first switch module, and prevent a parasitic inductance from limiting a switching frequency of the first switch module.

An embodiment of this application discloses a protection circuit, including: a first protection module and a freewheeling module. The first protection module is connected in parallel to a first switch module in a main circuit of a BMS, and the freewheeling module is connected in parallel to a load module in the main circuit of the BMS. The first switch module, the load module, and a second switch module in the main circuit of the BMS are serially-connected, and the first switch module is a switching transistor. The first protection module is configured to switch to a charging state when the first switch module is turned off, so as to stabilize a voltage between a first terminal of the first switch module and a second terminal of the first switch module. The freewheeling module is configured to switch on when the first switch module is turned off, so as to stabilize a voltage between the first switch module and the second switch module in the main circuit of the BMS.

An embodiment of this application further discloses a protection circuit, including: a first protection module, a second protection module, a first freewheeling module, and second freewheeling module. A first terminal of the first protection module is connected to a first terminal of a first switch module in a main circuit of a BMS. A second terminal of the first protection module is connected to a first terminal of the second protection module. A second terminal of the second protection module is connected to a first terminal of a second switch module in the main circuit of the BMS. A first terminal of the first freewheeling module is connected to a second terminal the first switch module. A second terminal of the first freewheeling module is connected to a first terminal of the second freewheeling module. A second terminal of the second freewheeling module is connected to a second terminal of the second switch module. A node between the second terminal of the first protection module and the first terminal of the second protection module is connected to a node between the second terminal of the first freewheeling module and the first terminal of the second freewheeling module. When the first switch module is turned off, the first protection module, the first freewheeling module, the second freewheeling module, and other modules than the second switch module in the main circuit are configured to form a path to stabilize a voltage between the first terminal of the first switch module and the second terminal of the first switch module, and a voltage between the first switch module and the second switch module. When the second switch module is turned off, the second protection module, the first freewheeling module, the second freewheeling module, and other modules than the second switch module in the main circuit are configured to form a path to stabilize a voltage between the first terminal of the second switch module and the second terminal of the second switch module, and a voltage between the first switch module and the second switch module.

An embodiment of this application further discloses a BMS, including: a main circuit and the protection circuit mentioned in the above embodiment. The main circuit includes a power supply module, a first switch module, a load module, and a second switch module. The power supply module, the first switch module, the load module, and the second switch module are serially-connected.

In contrast with the prior art, in this embodiment of this application, the first switch module is connected in parallel to the first protection module. When the first switch module is turned of, the first protection module switches to the charging state to absorb a spike voltage caused by the parasitic inductance, thereby avoiding excessive increase of a voltage between the first terminal of the first switch module and the second terminal of the first switch module, and reducing risks of breakdown of the first switch module. The freewheeling module is switched on when the first switch module is turned off, thereby stabilizing a voltage between the second terminal of the first switch module and the first terminal of the second switch module. The protection circuit can absorb in time the spike voltage caused by the parasitic inductance, thereby preventing the parasitic inductance from limiting a switching frequency of the first switch module.

For example, in addition, the second switch module is a switching transistor, and the protection circuit further includes a second protection module, and the second protection module is connected in parallel to the second switch module. The second protection module switches to a charging state when the second switch module is turned off, so as to stabilize a voltage between a first terminal of the second switch module and a second terminal of the second switch module. The freewheeling module is turned on when the second switch module is turned off, so as to stabilize a voltage between the first switch module and the second switch module. In this embodiment, the second switch module is connected in parallel to the second protection module. When the second switch module is turned off, the second protection module switches to the charging state to absorb a spike voltage caused by the parasitic inductance, thereby avoiding excessive increase of the voltage between the first terminal of the second switch module and the second terminal of the second switch module, and reducing risks of breakdown of the second switch module.

For example, the protection circuit further includes a voltage regulation module. The voltage regulation module is connected in parallel to the power supply module in the main circuit of the BMS to stabilize the voltage between the first switch module and the second switch module, or to stabilize a voltage between a third switch module and the second switch module in the main circuit of the BMS. In this embodiment, an impact caused by the spike voltage onto the first switch module is further reduced.

For example, the voltage regulation module includes a first capacitor.

For example, the first protection module includes a first energy storage submodule and a first anti-reverse submodule, and the first energy storage submodule is serially-connected to the first anti-reverse submodule. The first anti-reverse submodule is turned on when the voltage between the first terminal of the first switch module and the second terminal of the first switch module is greater than a first preset, value, so that the first energy storage submodule stores a spike voltage that occurs when the first switch module is turned off.

For example, the first energy storage submodule is a second capacitor, and the first anti-reverse submodule is a first diode.

For example, the first protection module further includes a first current limiting submodule; the first current limiting submodule, the first energy storage submodule, and the first anti-reverse submodule are serially-connected, and the first current limiting submodule is configured to stabilize a current of the main circuit when the first anti-reverse submodule is turned on. In this embodiment, the first current limiting submodule is serially-connected to the first anti-reverse submodule to avoid overcurrent in the main circuit.

For example, the first current limiting submodule is a first resistor.

For example, the first protection module further includes a first load submodule; the first load submodule is connected in parallel to the first anti-reverse submodule, and the first energy storage submodule performs charging or discharging through the first load submodule.

For example, the first load submodule is a third resistor.

For example, the second protection module includes a second energy storage submodule and a second anti-reverse submodule, and the second energy storage submodule is serially-connected to the second anti-reverse submodule. The second anti-reverse submodule is turned on when the voltage between the first terminal of the second switch module and the second terminal of the second switch module is greater than a second preset value, so that the second energy storage submodule stores a spike voltage that occurs when the second switch module is turned off.

For example, the second energy storage submodule is a third capacitor, and the second anti-reverse submodule is a second diode.

For example, the second protection module further includes a second current limiting submodule. The second current limiting submodule, the second energy storage submodule, and the second anti-reverse submodule are serially-connected. The second current limiting submodule is configured to stabilize a current of the main circuit when the second anti-reverse submodule is turned on.

For example, the second current limiting submodule is a second resistor.

For example, the second protection module further includes a second load submodule; the second load submodule is connected in parallel to the second anti-reverse submodule, and the second energy storage submodule performs charging or discharging through the second load submodule.

For example, the second load submodule is a fourth resistor.

For example, the protection circuit further includes a drive module and a detection module. The detection module is configured to detect whether the first switch module and the second switch module are in a normal working state. The drive module is configured to drive the first switch module and the second switch module according to a detection result of the detection module. In this embodiment, the drive module can turn off the first switch module and the second switch module in time when the first switch module and the second switch module are in an abnormal working state, so that the first switch module and the second switch module can work in a safe working region.

For example, the protection circuit further includes a voltage regulation module. The voltage regulation module is connected in parallel to the power supply module of the BMS to stabilize the voltage between the first switch module and the second switch module, or to stabilize a voltage between a third switch module and the second switch module in the main circuit of the BMS. In this embodiment, an impact caused by the spike voltage onto the first switch module is further reduced.

For example, the protection circuit further includes a first current limiting module and a second current limiting module. The first current limiting module is serially-connected to the first freewheeling module, and the second current limiting module is serially-connected to the second freewheeling module. The first current limiting module is configured to stabilize the current of the main circuit when the first switch module is turned off. The second current limiting module is configured to stabilize the current of the main circuit when the second switch module is turned off. In this embodiment, the first current limiting module is serially-connected to the first freewheeling module, and the second current limiting module is serially-connected to the second freewheeling module to avoid overcurrent in the main circuit.

For example, the protection circuit further includes a discharging module. A first terminal of the discharging module is connected to a node between the second terminal of the first protection module and the first terminal of the second protection module, and a second terminal of the discharging module is connected to the second terminal of the second current limiting module. The first protection module and the second protection module perform discharging through the discharging module.

For example, the first protection module is a first capacitor, the second protection module is a second capacitor, the first freewheeling module is a first diode, and the second freewheeling module is a second diode.

For example, the voltage regulation module is a third capacitor.

For example, the first current limiting module is a first resistor, and the second current limiting module is a second resistor.

For example, the discharging module is a third resistor.

DESCRIPTION OF DRAWINGS

One or more embodiments are described exemplarily with reference to accompanying drawings corresponding to the embodiments. The exemplary description shall not constitute any limitation on the embodiments. Components labeled with the same reference numeral in the accompanying drawings represent similar components. Unless otherwise specified, the accompanying drawings are not subject to a scale limitation.

DESCRIPTION OF EMBODIMENTS

Figure 1:
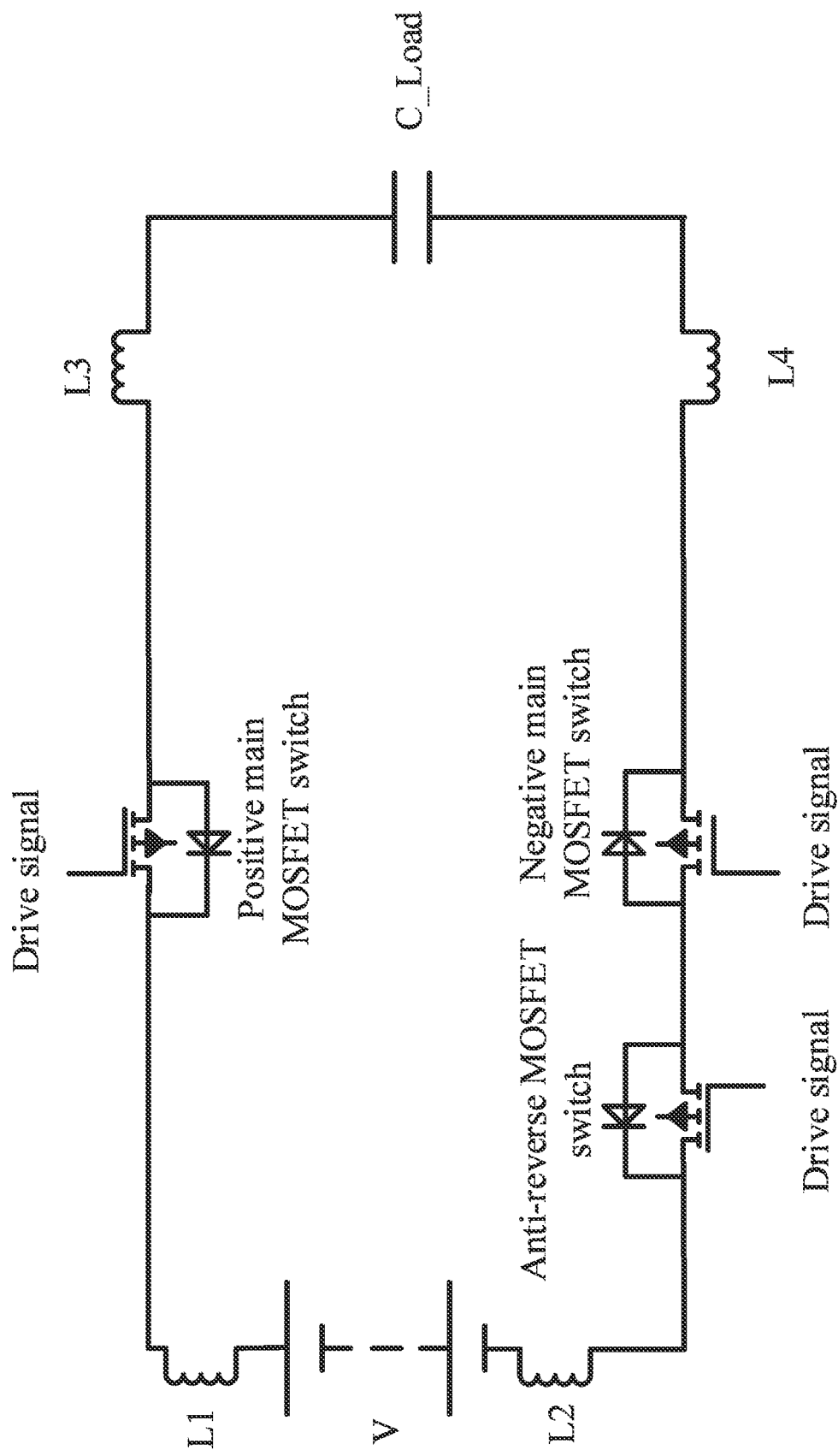
FIG. 1 is a schematic diagram of application of a conventional semiconductor power device in a BMS in the prior art.

The inventor finds that at least the following problems exist in the prior art: the application of conventional semiconductor power devices in a BMS is shown in FIG. which a main circuit primarily includes a power supply (V), a MOSFET switch, a parasitic inductance, and a load capacitor (C_Load). The MOSFET switch includes a positive main MOSFET switch, a negative main MOSFET switch, and an anti-reverse MOSFET switch. On and off states of the MOSFET are controlled by a microcontroller unit (MCU). L1, L2, L3, and L4 represent parasitic inductances on a wire harness. Wire harnesses at a load end are larger in number and in length, and therefore, L3 and L4 are much greater than L1 and L2. If a greater current is passed when the MOSFET switch is turned on, more energy is stored in the parasitic inductance. When the MOSFET switch is turned off, a drain-source voltage of the MOSFET switch will increase due to an effect of the parasitic inductance. If the switching frequency is higher, a greater current will be passed when the switch is turned on, and a greater induced electromotive force will be generated at both ends of an inductor. When the drain-source voltage of the MOSFET is exceeded, the MOSFET will be broken down. Although the MOSFET itself has a relatively high switching frequency, the parasitic inductance limits the increase of the switching frequency of the MOSFET.

To make the objectives, technical solutions, and advantages of this application clearer, the following describes some embodiments of this application in further detail with reference to accompanying drawings and embodiments. Understandably, the specific embodiments described herein are merely intended to explain this application, but are not intended to limit this application.

A first embodiment of this application relates to a protection circuit. The protection circuit is mainly configured to protect a semiconductor power device such as a MOSFET, and the protection circuit includes: a first protection module and a freewheeling module. The first protection module is connected in parallel to a first switch module in a main circuit of a BMS, and the freewheeling module is connected in parallel to a load module in the main circuit of the BMS. The first switch module, the load module, and a second switch module in the main circuit of the BMS are serially-connected, and the first switch module is a switching transistor. The first protection module switches to a charging state when the first switch module is turned off, so as to stabilize a voltage between a first terminal of the first switch nodule and a second terminal of the first switch module. The freewheeling module is configured to be turned on when the first switch module is turned off, so as to stabilize the voltage between the second terminal of the first switch module and the first terminal of the second switch module.

In an embodiment, the protection circuit may further include a voltage regulation module. The voltage regulation module is connected in parallel to a power supply module in the main circuit of the BMS to stabilize the voltage between the first switch module and the second switch module, or to stabilize a voltage between a third switch module and the second switch module in the main circuit of the BMS.

In an embodiment, the voltage regulation module is a first capacitor.

The following describes an example of a structure of the protection circuit.

Figure 2:
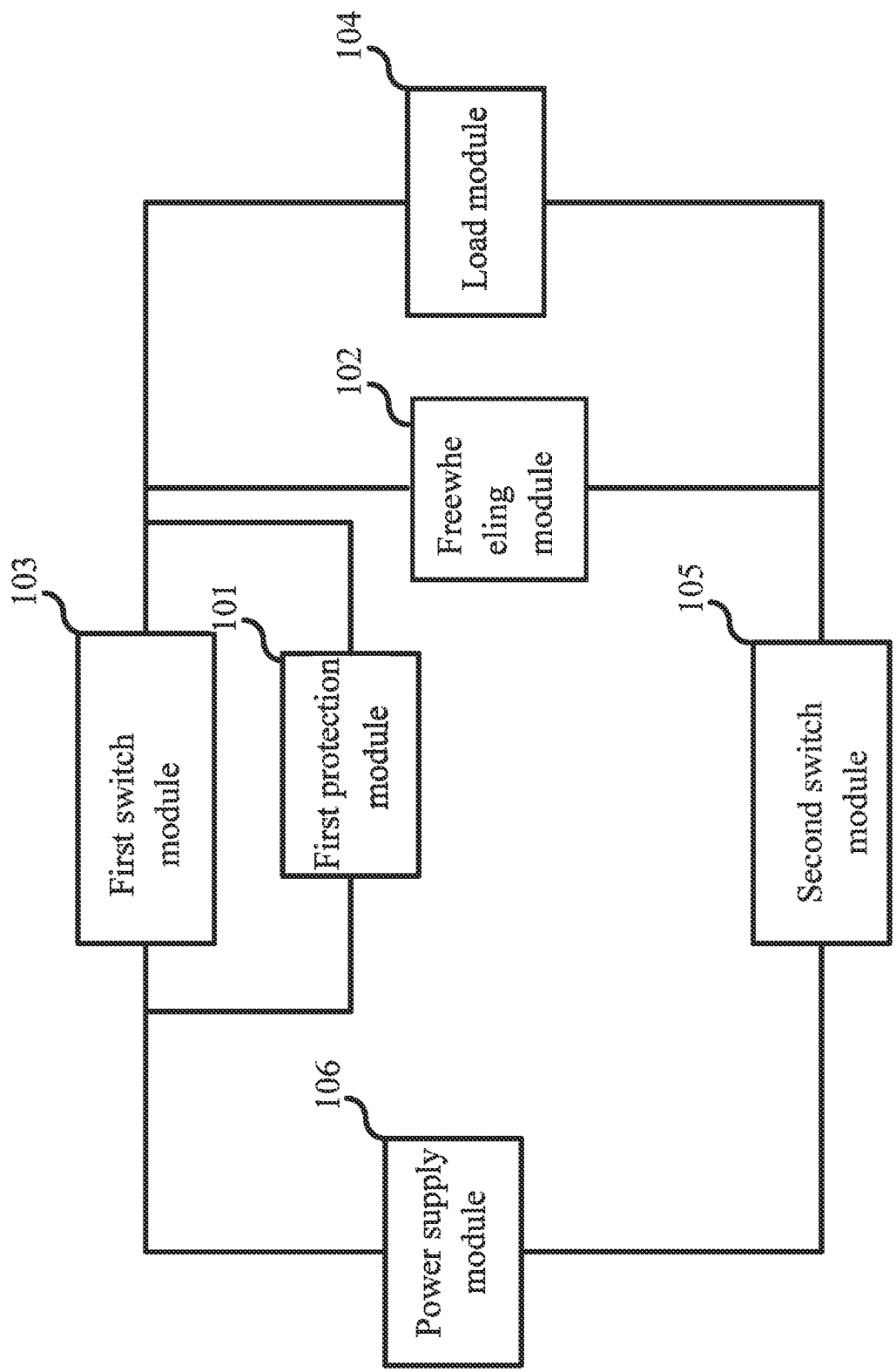
FIG. 2 is a schematic structural diagram of a protection circuit according to a first embodiment of this application.

Scenario 1: As shown in FIG. 2, a first switch module 103 is a positive main MOSFET switching transistor, and a second switch module 105 is a negative main relay. In this case, in a main circuit, a power supply module 106, a first switch module 103, a load module 104, and a second switch module 105 are serially-connected in sequence. A first protection module 101 is connected in parallel to the first switch module 103, and a freewheeling module 102 is connected in parallel to the load module 104.

Figure 3:
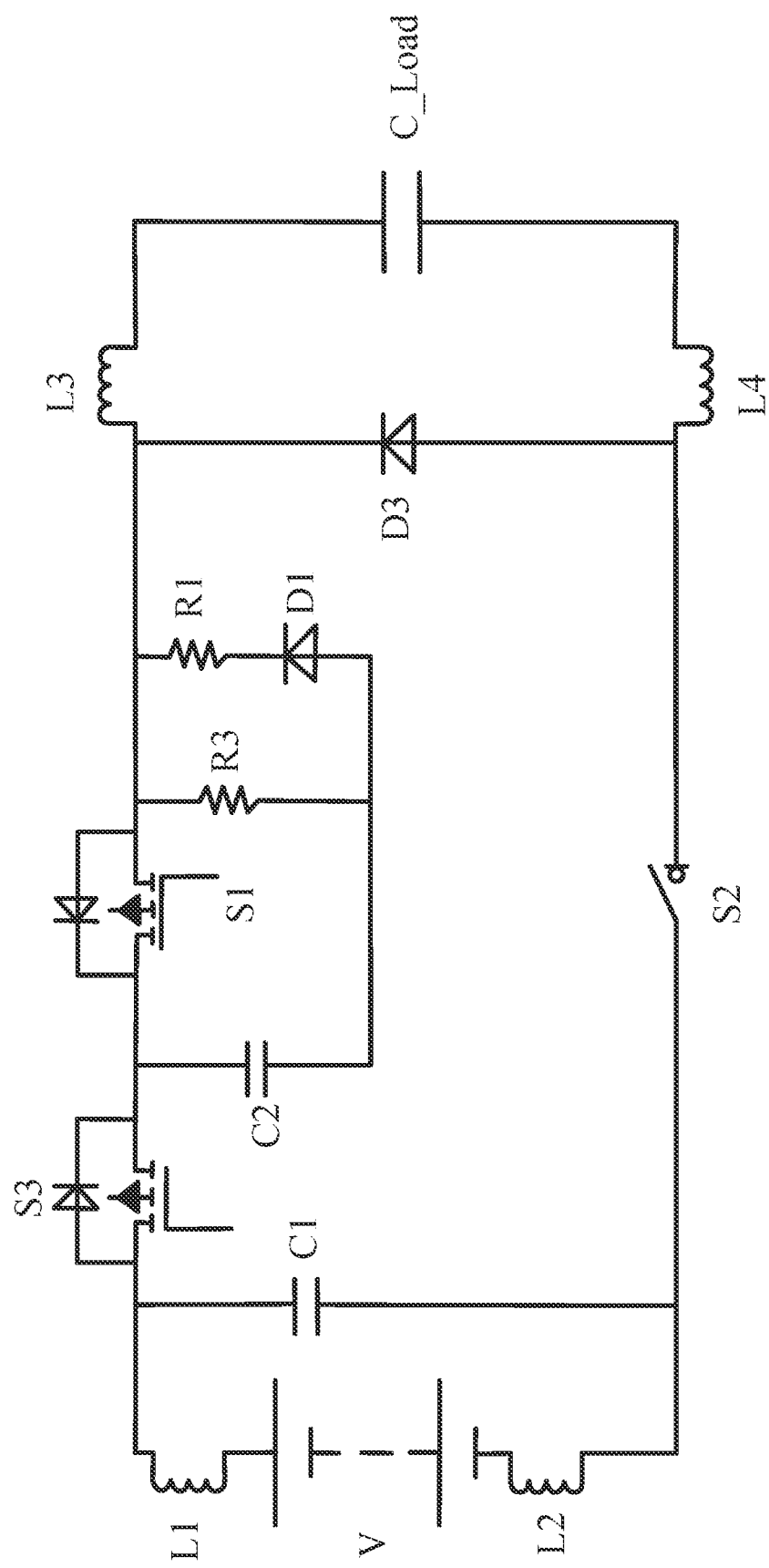
FIG. 3 is a schematic circuit diagram of a protection circuit according to a first embodiment of this application.

In an embodiment, the first protection module includes a first energy storage submodule and a first anti-reverse submodule, and the first energy storage submodule is serially-connected to the first anti-reverse submodule. The first anti-reverse submodule is turned on when the voltage between the first terminal of the first switch module and the second terminal of the first switch module is greater than a first preset value, so that the first energy storage submodule stores a spike voltage that occurs when the first switch module is turned off. The first preset value is less than a rated drain-source voltage of the first switch module. To avoid overcurrent of the main circuit, the first protection module further includes a first current limiting submodule. The first current limiting submodule, the first energy storage submodule, and the first anti-reverse submodule are serially-connected. The first current limiting submodule is configured to stabilize a current of the main circuit when the first anti-reverse submodule is turned on, To implement rapid charging or discharging of the first energy storage submodule, the first protection module may further include a first load submodule. The first load submodule is connected in parallel to the first anti-reverse submodule, and the first energy storage submodule performs charging or discharging through the first load submodule. The first energy storage submodule may be a second capacitor, and the first anti-reverse submodule may be a first diode. The first current limiting submodule may be a first resistor, and the first load submodule may be a third resistor. In this case, a circuit diagram of the protection circuit is shown in FIG. 3. In FIG. 3, V denotes the power supply module, C1 denotes the first capacitor, C2 denotes the second capacitor, S1 denotes the first switch module, R3 denotes the third resistor, R1 denotes the first resistor, D1 denotes the first diode, D3 denotes the third diode, C_Load denotes the load module, S2 denotes the second switch module, S3 denotes the third switch module, and L1, L2, L3, and L4 denote parasitic inductance in branch circuits respectively.

The first current limiting submodule is serially-connected to the first anti-reverse submodule to avoid overcurrent in the main circuit.

In FIG. 3, the protection circuit is illustrated by using an example in which the first energy storage submodule is the second capacitor, the first anti-reverse submodule is the first diode, the first current limiting submodule is the first resistor, and the first load submodule is the third resistor. In practical applications, the first energy storage submodule, the first anti-reverse submodule, the first current limiting submodule, and the first load submodule may be other components that serve similar functions.

This embodiment is described by using an example in which the first protection module includes a first energy storage submodule, a first anti-reverse submodule, a first current limiting submodule, and a first load submodule. A person skilled in the art understands that in practical applications, the first protection module can implement protection for the first switch module in a case that the first protection module simply includes the first energy storage submodule and the first anti-reverse submodule. This embodiment does not limit specific circuits of the first protection module.

Figure 4:
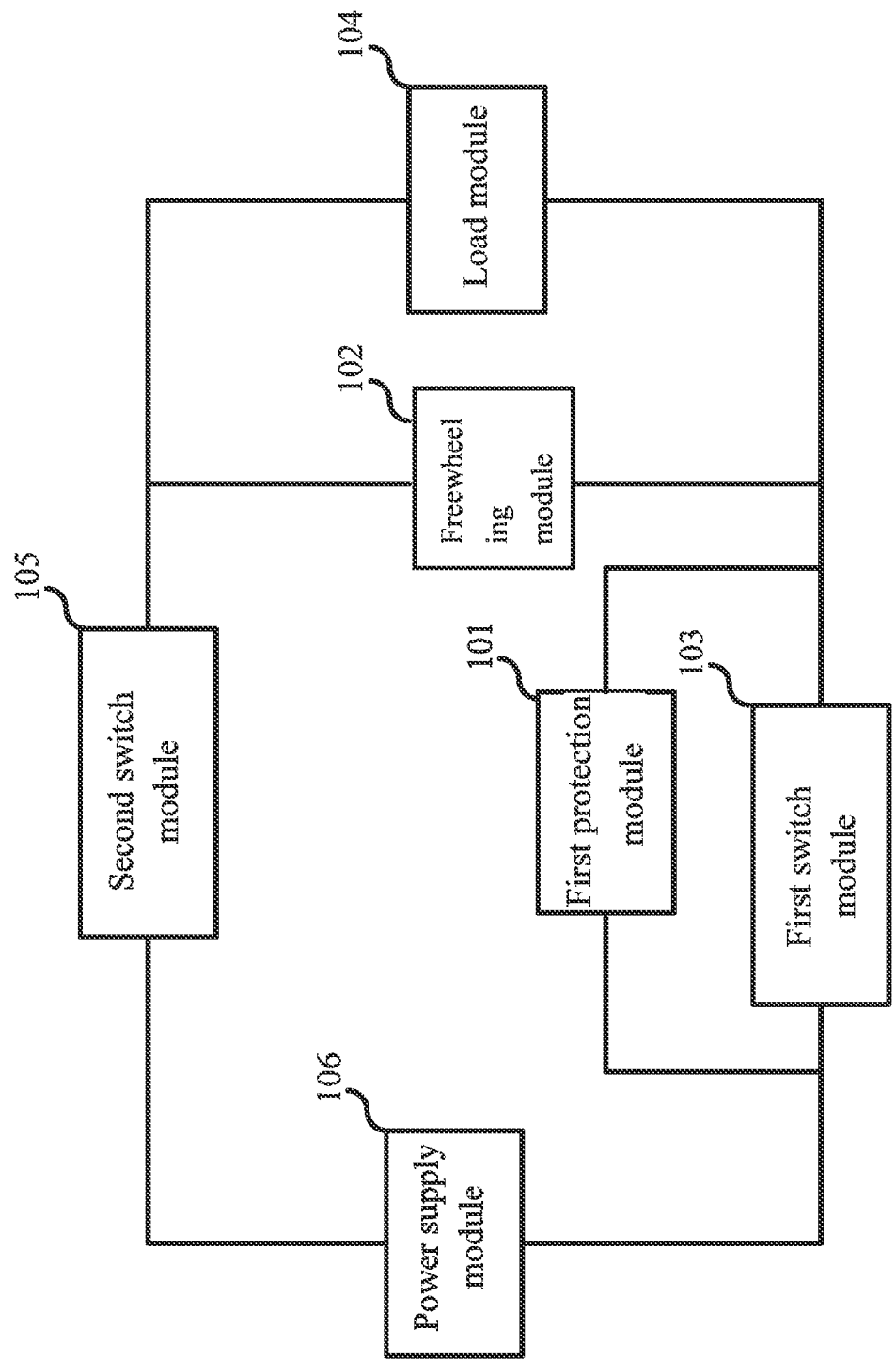
FIG. 4 is a schematic structural diagram of another protection circuit according to a first embodiment of this application.

Scenario 2: As shown in FIG. 4, the second switch module 105 is a positive main relay, and the first switch module 103 is a negative main MOSFET switching transistor. In this case, in the main circuit, the power supply module 106, the second switch module 105, the load module 104, and the first switch module 103 are serially-connected in sequence. The first protection module 101 is connected in parallel to the first switch module 103, and the freewheeling module 102 is connected in parallel to the load module 104.

Figure 5:
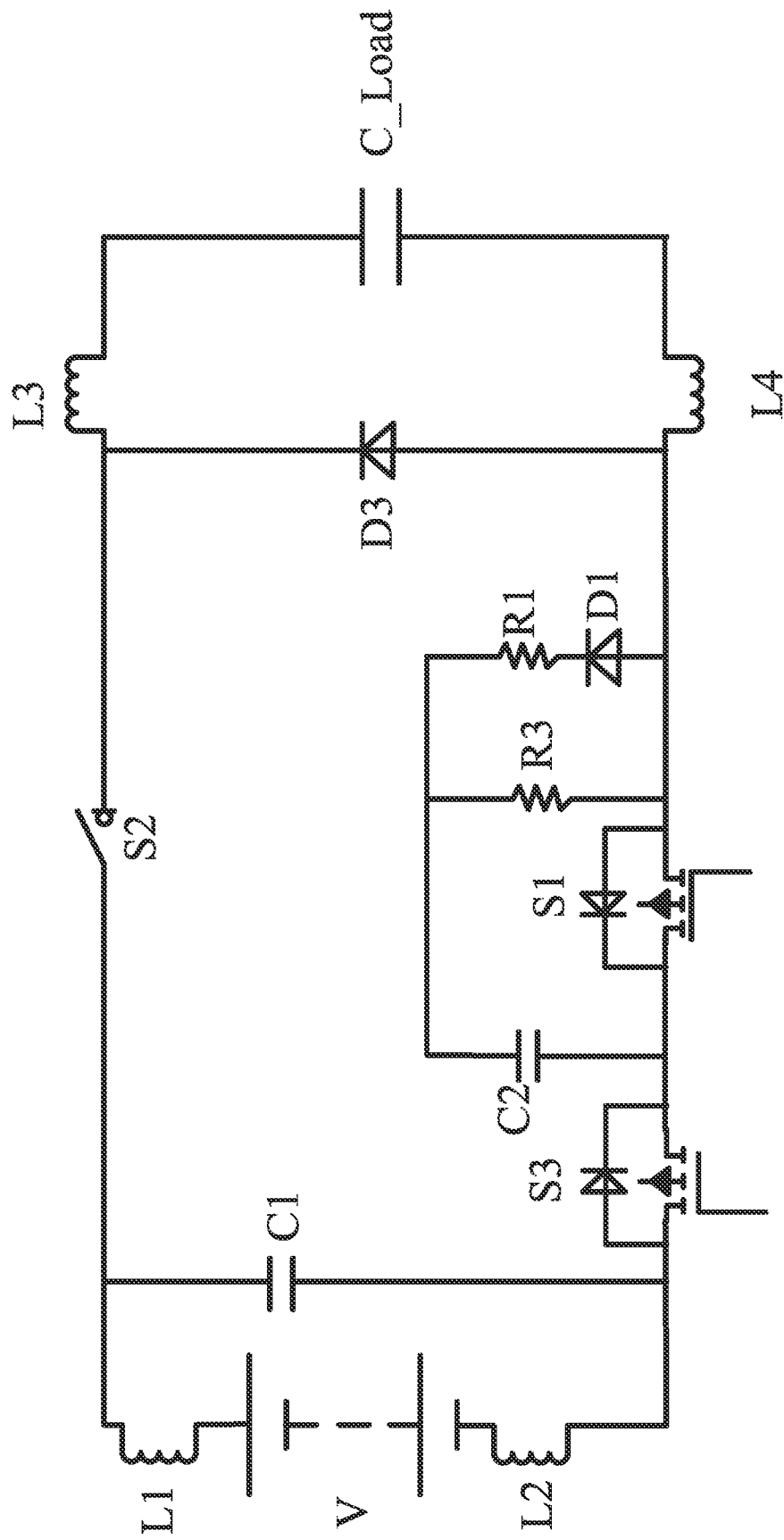
FIG. 5 is a schematic circuit diagram of another protection circuit according to a first embodiment of this application.

In an embodiment, the first protection module includes a first energy storage submodule and a first anti-reverse submodule, and the first energy storage submodule is serially-connected to the first anti-reverse submodule. The first anti-reverse submodule is turned on when the voltage between the first terminal of the first switch module and the second terminal of the first switch module is greater than a first preset value, so that the first energy storage submodule stores a spike voltage that occurs when the first switch module is turned off. The first preset value is less than a rated drain-source voltage of the first switch module. The first protection module further includes a first current limiting submodule; the first current limiting submodule, the first energy storage submodule, and the first anti-reverse submodule are serially-connected, and the first current limiting submodule is configured to stabilize the current of the main circuit when the first anti-reverse submodule is turned on. The first protection module further includes a first load submodule the first load submodule is connected in parallel to the first anti-reverse submodule, and the first energy storage submodule performs charging or discharging through the first load submodule. The first energy storage submodule may be a second capacitor, and the first anti-reverse submodule may be a first diode. The first current limiting submodule may be a first resistor, and the first load submodule may be a third resistor. In this case, a circuit diagram of the protection circuit is shown in FIG. 5. Ira FIG. 5, V denotes the power supply module, C1 denotes the first capacitor, C2 denotes the second capacitor, S1 denotes the first switch module, R3 denotes the third resistor, R1 denotes the first resistor, D1 denotes the first diode, D3 denotes the third diode, C_Load denotes the load module, S2 denotes the second switch module, S3 denotes the third switch module, and L1, L2, L3, and L4 denote parasitic inductance in branch circuits respectively.

This embodiment is described by using an example in which the first protection module includes a first energy storage submodule, a first anti-reverse submodule, a first current limiting submodule, and a first load submodule. A person skilled in the art understands that in practical applications, the first protection module can implement protection for the first switch module in a case that the first protection module simply includes the first energy storage submodule and the first anti-reverse submodule. This embodiment does not limit specific circuits of the first protection module.

Figure 6:
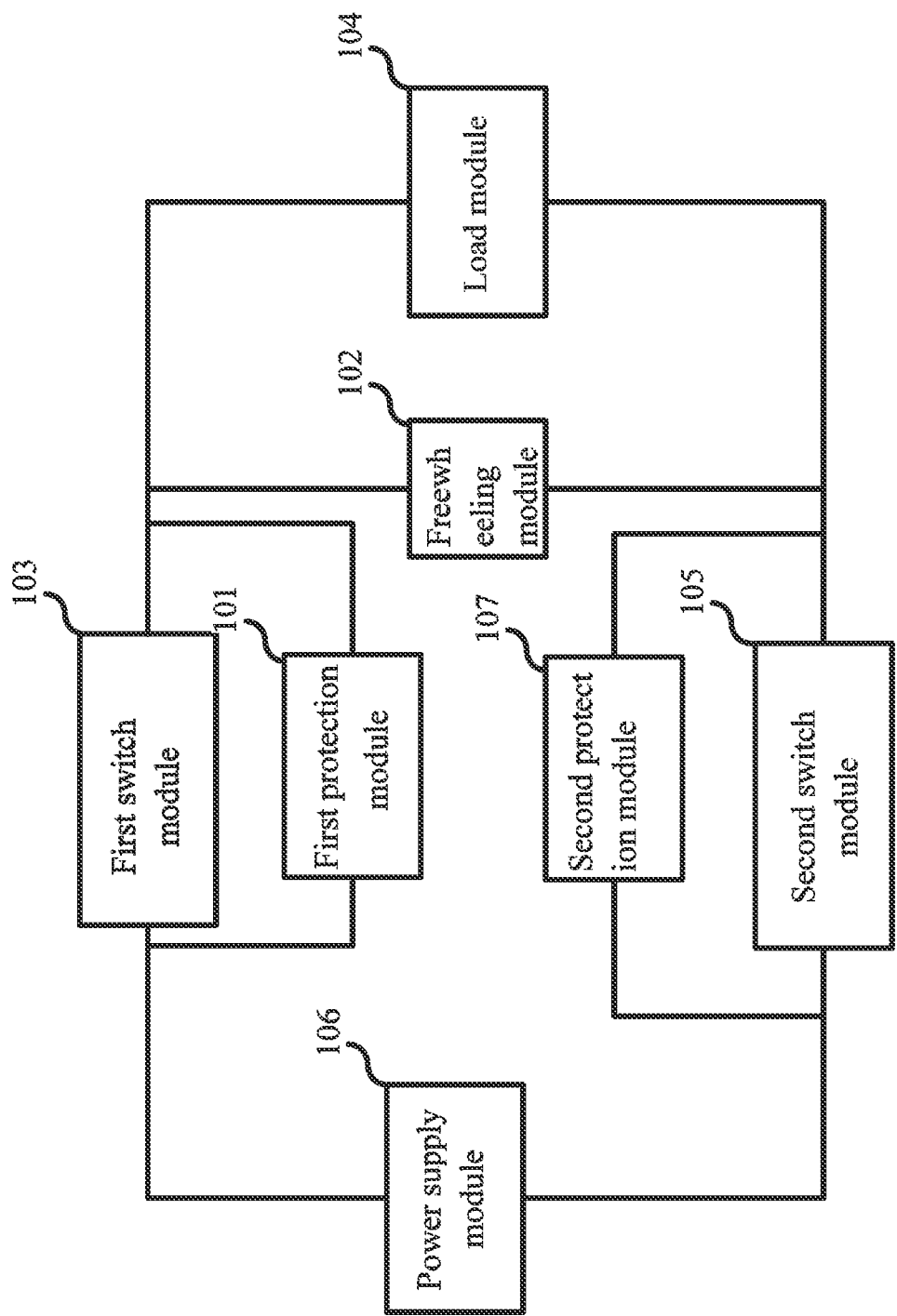
FIG. 6 is a schematic structural diagram of still another protection circuit according to a first embodiment of this application.

Scenario 3: As shown in FIG. 6, the first switch module 103 and the second switch module 105 are both switching transistors. The first switch module 103 is a positive main MOSFET switching transistor, and the second switch module 105 is a negative main MOSFET switching transistor. In this case, the protection circuit further includes a second protection module 107. The second protection module 107 is connected in parallel to the second switch module 105. The second protection module 107 switches to a charging state when the second switch module 105 is turned off, so as to stabilize a voltage between a first terminal of the second switch module 105 and a second terminal of the second switch module 105. The freewheeling module 102 is turned on when the second switch module 105 is turned off, so as to stabilize the voltage between the first switch module 103 and the second switch module 105.

Figure 7:
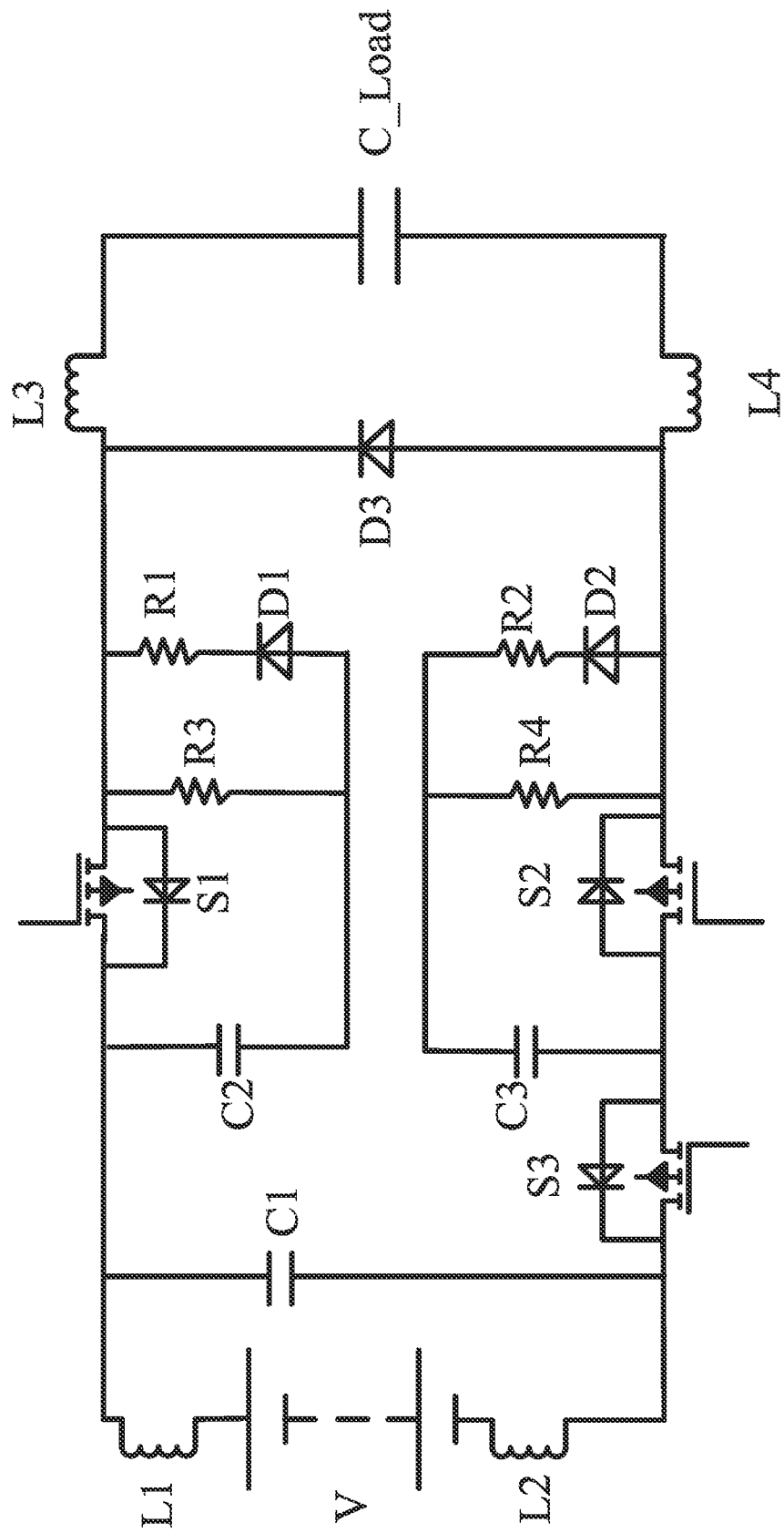
FIG. 7 is a schematic circuit diagram of still another protection circuit according to a first embodiment of this application.

In an embodiment, the first protection module includes a first energy storage submodule and a first anti-reverse submodule, and the first energy storage submodule is serially-connected to the first anti-reverse submodule. The first anti-reverse submodule is turned on when the voltage between the first terminal of the first switch module and the second terminal of the first switch module is greater than a first preset value, so that the first energy storage submodule stores a spike voltage that occurs when the first switch module is turned off. The first preset value is less than a rated drain-source voltage of the first switch module. The first protection module further includes a first current limiting submodule; the first current limiting submodule, the first energy storage submodule, and the first anti-reverse submodule are serially-connected, and the first current limiting submodule is configured to stabilize the current of the main circuit when the first anti-reverse submodule is turned on. The first protection module further includes a first load submodule; the first load submodule is connected in parallel to the first anti-reverse submodule, and the first energy storage submodule performs charging or discharging through the first load submodule. The second protection module includes a second energy storage submodule and a second anti-reverse submodule, and the second energy storage submodule is serially-connected to the second anti-reverse submodule. The second anti-reverse submodule is turned on when the voltage between the first terminal of the second switch module and the second terminal of the second switch module is greater than a second preset value, so that the second energy storage submodule stores a spike voltage that occurs when the second switch module is turned off. To avoid overcurrent of the main circuit, the second protection module may further include a second current limiting submodule. The second current limiting submodule, the second energy storage submodule, and the second anti-reverse submodule are serially-connected. The second current limiting submodule is configured to stabilize the current of the main circuit when the second anti-reverse submodule is turned on. To implement rapid charging or discharging of the second energy storage submodule, the second protection module may further include a second load submodule. The second load submodule is connected in parallel to the second anti-reverse submodule, and the second energy storage submodule performs charging or discharging through the second load submodule. The first energy storage submodule may be a second capacitor. The first anti-reverse submodule may be a first diode. The first current limiting submodule may be a first resistor. The first load submodule may be a third resistor. The second energy storage submodule may be a third capacitor. The second anti-reverse submodule may be a second diode. The second current limiting submodule may be a second resistor. The second load submodule may be a fourth resistor. In this case, a schematic circuit diagram of the protection circuit is shown in FIG. 7. In FIG. 7, V denotes the power supply module, C1 denotes the first capacitor, C2 denotes the second capacitor, C3 denotes the third capacitor, S1 denotes the first switch module, S2 denotes the second switch module, S3 denotes the third switch module, R1 denotes the first resistor, R2 denotes the second resistor, R3 denotes the third resistor, R4 denotes the fourth resistor, D1 denotes the first diode, D2 denotes the second diode, D3 denotes the third diode, C_Load denotes the load module, and L1, L2, L3, and L4 denote parasitic inductance in branch circuits respectively.

A person skilled in the art understands that in FIG. 7, the specific structure of the protection circuit is illustrated by using an example in which the second energy storage submodule is the third capacitor, the second anti-reverse submodule is the second diode, the second current limiting submodule is the second resistor, and the second load submodule is the fourth resistor. In practical applications, the second energy storage submodule, the second anti-reverse submodule, the second current limiting submodule, and the second load submodule may be other components that serve similar functions.

This embodiment is described by using an example in which the first protection module includes a first energy storage submodule, a first anti-reverse submodule, a first current limiting submodule, and a first load submodule, and in which the second protection module includes a second energy storage submodule, a second anti-reverse submodule, a second current limiting submodule, and a second load submodule. A person skilled in the art understands that in practical applications, the first protection module can implement protection for the first switch module in a case that the first protection module simply includes the first energy storage submodule and the first anti-reverse submodule. This embodiment does not limit specific circuits of the first protection module.

The second switch module is connected in parallel to the second protection module. When the second switch module is turned off, the second protection module switches to the charging state to absorb a spike voltage caused by the parasitic inductance, thereby avoiding excessive increase of the voltage between the first terminal of the second switch module and the second terminal of the second switch module, and reducing risks of breakdown of the second switch module.

A person skilled in the art understands that in practical applications, the first switch module may be a negative main MOSFET switching transistor, and the second switch module may be a positive main MOSFET switching transistor. In this case, the structure of the protection circuit is substantially the same as that shown in FIG. 4, and details are omitted here.

In an embodiment, the protection circuit further includes a drive module and a detection module. The detection module is configured to detect whether the first switch module and the second switch module are in a normal working state. The drive module is configured to drive the first switch module and the second switch module according to a detection result of the detection module. For example, the detection module detects the current of the main circuit, a temperature and a drain-source voltage of the first switch module, and a temperature and a drain-source voltage of the second switch module. The first switch module and the second switch module are considered to be in an abnormal working state if it is determined that the current of the main circuit is greater than a first preset value, or that the temperature of the first switch module is greater than a second preset value, or that the drain-source voltage of the first switch module is greater than a third preset value, or that the temperature of the second switch module is greater than a fourth preset value, or that the drain-source voltage of the second switch module is greater than the fifth preset value. In this case, the drive module turns off the first switch module and the second switch module.

Figure 8:
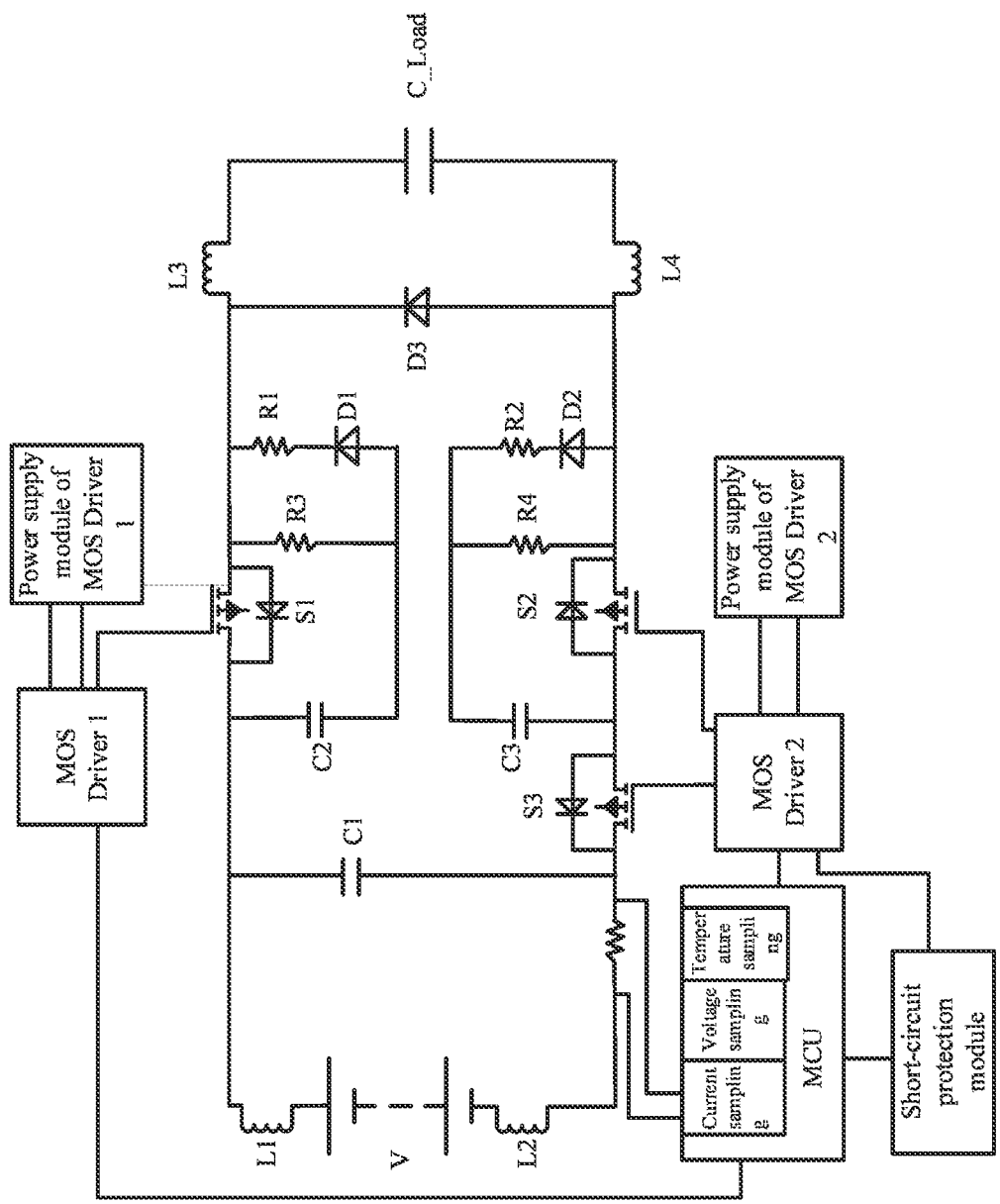
FIG. 8 is a circuit diagram of yet another protection circuit according to a first embodiment of this application.

In an embodiment, a circuit diagram of the protection circuit is shown in FIG. 8, in which the detection module is an MCU, a fifth resistor (R5) is serially-connected between the power supply module (V) and the third switch module (S3), and the drive module includes a first driving submodule and a second driving submodule. The MCU samples the current of R5, and determines, according to a sampling result, whether the first switch module and the second switch module are in a normal working state, and outputs a determining result to the first drive module (MOS Driver 1) and the second driving submodule (MOS Driver 2). The first driving submodule drives the first switch module according to the determining result, and the second driving submodule drives the second switch module and the third switch module according to the determining result. In FIG. 8, V denotes the power supply module, C1 denotes the first capacitor, C2 denotes the second capacitor, C3 denotes the third capacitor, S1 denotes the first switch module, S2 denotes the second switch module, S3 denotes the third switch module, R1 denotes the first resistor, R2 denotes the second resistor, R3 denotes the third resistor, R4 denotes the fourth resistor, D1 denotes the first diode, D2 denotes the second diode, D3 denotes the third diode, C_Load denotes the load module, and L1, L2, L3, and L4 denote parasitic inductance in branch circuits respectively.

The drive module can turn off the first switch module and the second switch module in time when the first switch module and the second switch module are in an abnormal working state, so that the first switch module and the second switch module can work in a safe working region.

In practical applications, as shown in FIG. 8, the main circuit may further include other modules such as a short-circuit protection module, a power supply module of the MOS Driver 1, and a power supply module of the MOS Driver 2. To highlight an innovation part of this application, the first embodiment does not describe modules that are not closely related to solving the technical issues put forward in this application, which, however, shall not mean that no other modules exist in the first embodiment.

In contrast with the prior art, in the protection circuit disclosed in this embodiment, the first switch module is connected in parallel to the first protection module. When the first switch module is turned off, the first protection module switches to the charging state to absorb a spike voltage caused by the parasitic inductance, thereby avoiding excessive increase of a voltage between the first terminal of the first switch module and the second terminal of the first switch module, and reducing risks of breakdown of the first switch module. The second switch module is connected in parallel to the second protection module. When the second switch module is turned off, the second protection module switches to the charging state to absorb a spike voltage caused by the parasitic inductance, thereby avoiding excessive increase of the voltage between the first terminal of the second switch module and the second terminal of the second switch module, and reducing risks of breakdown of the second switch module. The freewheeling module is turned on when the first switch module or the second switch module is turned off, thereby stabilizing the voltage between the second terminal of the first switch module and the first terminal of the second switch module. The protection circuit can absorb in time the spike voltage caused by the parasitic inductance, thereby preventing the parasitic inductance from limiting a switching frequency of the first switch module and the second switch module.

A second embodiment of this application relates to a protection circuit. This embodiment is a more detailed rendering of the first embodiment, and specifically describes an embodiment of the protection circuit and working principles thereof.

This embodiment describes the protection circuit by using an example in which the protection circuit includes a first protection module, a second protection module, a voltage regulation module, and a freewheeling module. A person skilled in the art understands that the voltage regulation module is not a mandatory module of the protection circuit, but is optional in the protection circuit.

This embodiment describes the first protection module and the second protection module by using an example in which the first protection module includes a first energy storage submodule, a first anti-reverse submodule, a first current limiting submodule, and a first load submodule, and in which the second protection module includes a second energy storage submodule, a second anti-reverse submodule, a second current limiting submodule, and a second load submodule. A person skilled in the art understands that in practical applications, the first load submodule, the first current limiting submodule, the second load submodule, and the second current limiting submodule are not mandatory submodules of the first protection module or the second protection module, and may be configured or not depending on needs.

Figure 9:
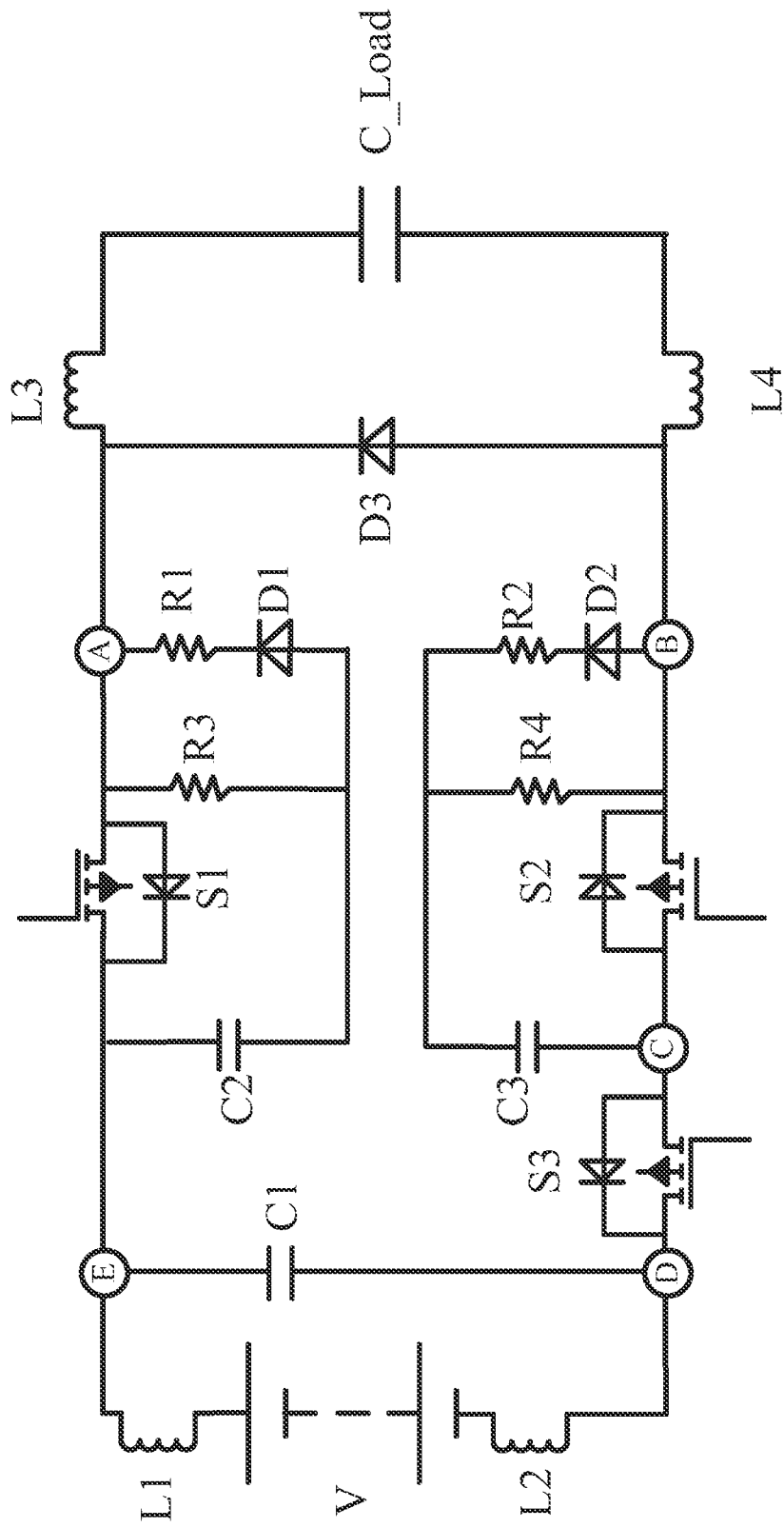
FIG. 9 is a schematic circuit diagram of a protection circuit according to a second embodiment of this application.

As shown in FIG. 9, a main circuit includes a power supply (V), a first switch module (S1), a load capacitor (C_Load), a second switch module (S2), and a third switch module (S3). Each wire used to connect components in the main circuit has a parasitic inductance. Therefore, the main circuit further includes: a first parasitic inductance (L1), a second parasitic inductance (L2), a third parasitic inductance (L3) and a fourth parasitic inductance (L4). A wire between the second switch module and the third switch module is relatively short, and therefore, has a parasitic inductance that is much smaller than that of L2, L3, and L4, and such parasitic inductance is not analyzed in this embodiment. The protection circuit includes a first protection module, a second protection module, a freewheeling module, and a voltage regulation module. The first protection module includes a first energy storage submodule, a first anti-reverse submodule, a first current limiting submodule, and a first load submodule. The second protection module includes a second energy storage submodule, a second anti-reverse submodule, a second current limiting submodule, and a second load submodule. In this embodiment, the voltage regulation module is a first capacitor (C1), the freewheeling module is a third diode (D3), the first energy, storage submodule is a second capacitor (C2), the first anti-reverse submodule is a first diode (D1), the first current limiting submodule is a first resistor (R1), the first load submodule is a third resistor (R3), the second energy storage submodule is a third capacitor (C3), the second anti-reverse submodule is a second diode (D2), a second current limiting submodule is a second resistor (R2), and the second load submodule is a fourth resistor (R4). In practical applications, the first switch module may be a positive main switch module, the second switch module may be a negative main switch module, and the third switch module may be an anti-reverse switch module. The drive module controls and outputs drive signals for the three switch modules. The three switch modules work together to make the circuit available for charging and discharging. During a discharge process, all the drive signals of the first switch module, the second switch module, and the third switch module are at a high level. In a case that the main circuit needs to be turned off in an emergency, the drive level for the first switch module or the second switch module becomes a low level, so as to turn off the main circuit. However, due to impact of L1, L2, L3, and LA when the first switch module or the second switch module is turned off, L1, L2, L3, and L4 may generate an induced electromotive force, thereby increasing a drain-source voltage (a voltage between a drain and a source) of the first switch module or the second switch module. In a case that the generated induced electromotive force exceeds a rated drain-source voltage of the first switch module or the second switch module, the first switch module or the second switch module is broken down. Therefore, a protection circuit needs to be added to protect the first switch module and the second switch module.

The following describes the working principles of the protection circuit in a case that the first switch module (S1) is turned off.

Figure 10:
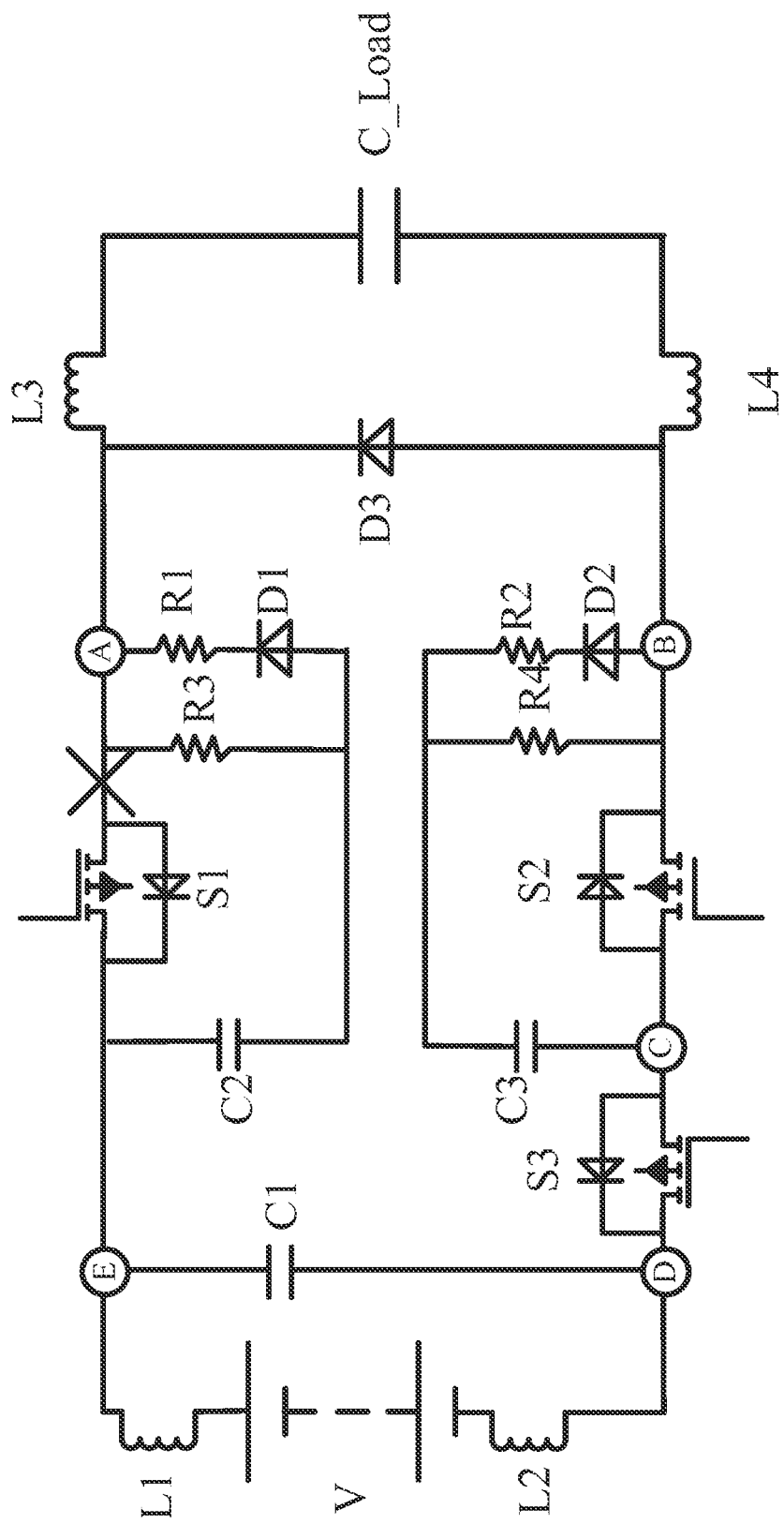
FIG. 10 is a schematic circuit diagram of a main circuit and a protection circuit when a first switch module is turned off according to a second embodiment of this application.

When S1 is turned off, a schematic circuit diagram of the main circuit and the protection circuit is shown in FIG. 10. When S1 is turned off, the current in the main circuit decreases, and the parasitic inductances L1, L2, L3, and L4 generate an induced electromotive force in the same direction as a direction of a current passed in the main circuit when S1 is not off. At this time, a potential at point E(VE)=VPACK+E1, where VPACK is the voltage of the power supply, E1 is the induced electromotive force generated by L1. A potential at point A(VA)=V_C_Load−E4−E3−E2, where V_C_Load is the voltage stored in the load capacitor, and E4, E3, and E2 are induced electromotive forces generated by the parasitic inductances L4, L3, and L2, respectively. When a difference between VE and VA is less than a forward on-state voltage of D1, a D1 branch circuit is cut off. In this case, if the voltage between points A and E is higher than the voltage of C2, then C2 is slowly charged through an R3 branch circuit. The expression "slowly charged" is used because the resistance of R1 is much smaller than that of R3 and a charging speed of C2 is slow. If the voltage between points A and E is lower than the voltage of C2, then C2 is discharged through the R3 branch circuit. When the difference between VE and VA increases to a specific degree, D will be turned on, and C2 is quickly charged through D1 and R1, so that the difference between VE and VA will not be too great. When S1 is turned on again, the potentials at points A and E are almost the same, and therefore, D1 is cut off. The voltage between points A and E is lower than the voltage of C2, and C2 is discharged through the R3 branch circuit.

When S1 is off, the potential at point B is VB=−E2. When the difference between VB and VA is greater than the forward on-state voltage of D3, D3 is turned on. Therefore, a potential difference between points VB and VA is clamped to the forward on-state voltage of D3.

During an off state of S1, the potentials at points B and C are equal. Therefore, the potentials at C3, R4, R2, and D2 remain unchanged.

The following describes the working principles of the protection circuit in a case that the second switch module (S2) is turned off.

Figure 11:
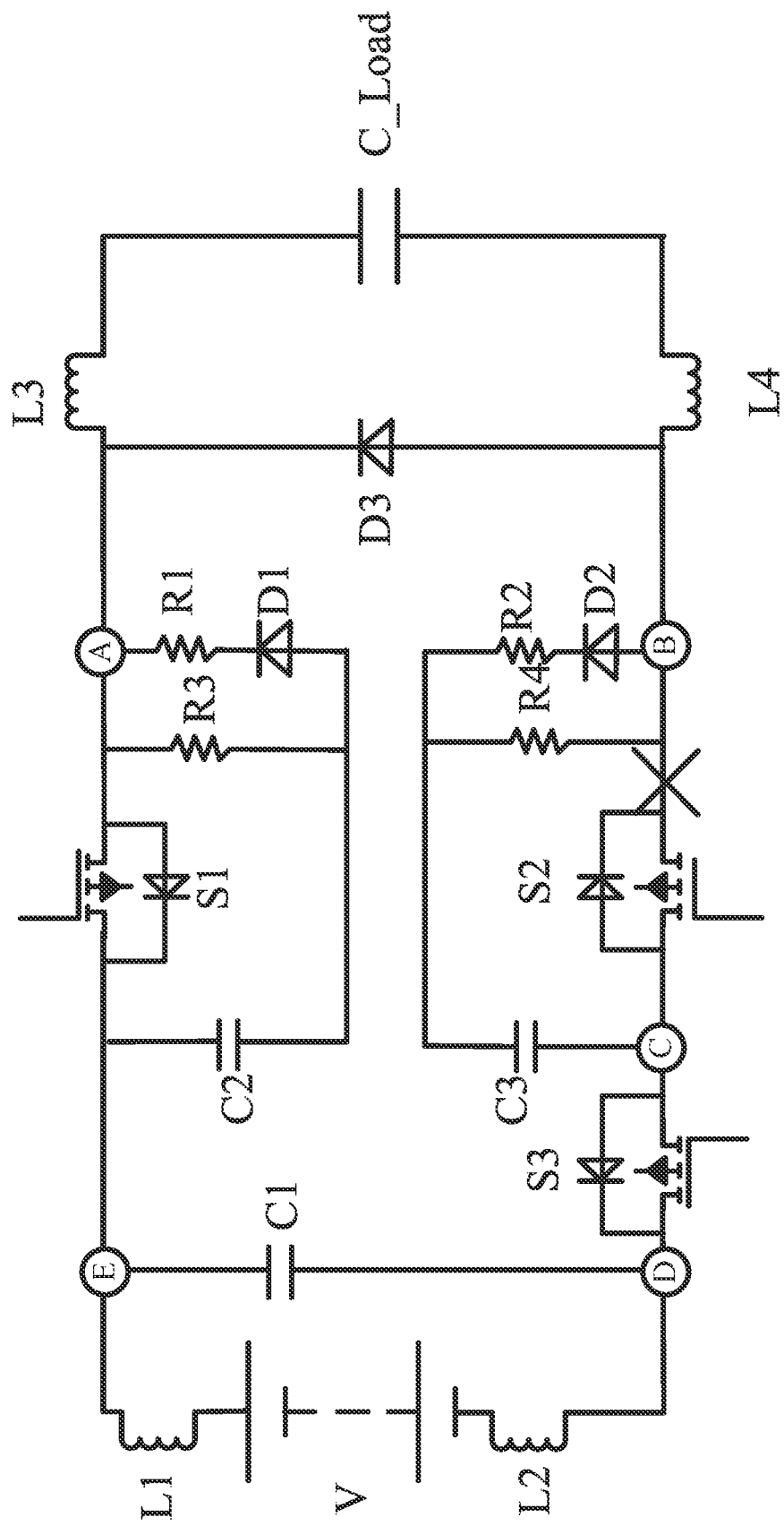
FIG. 11 is a schematic circuit diagram of a main circuit and a protection circuit when a second switch module is turned off according to a second embodiment of this application.

When S2 is turned off, a schematic circuit diagram of the main circuit and the protection circuit is shown in FIG. 11, Similar to the circumstance in which S1 is turned off, when S2 is turned off, the current in the main circuit decreases, and the parasitic inductances L1, L2, L3, and L4 generate an induced electromotive force in the same direction as a direction of a current passed in the main circuit when S2 is not off. The potential at point B (VB)=VPACK+E1+E3−V_C_Load+E4; and the potential at point C (VC)=−E2. When a difference between VB and VC is less than a forward on-state voltage of D2, a D2 branch circuit is cut off. In this case, if the voltage between points B and C is higher than the voltage of C3, then C3 is slowly charged through an R4 branch circuit. The expression "slowly charged" is used because the resistance of R2 is much smaller than that of R4 and a charging speed of C3 is slow. If the voltage between points B and C is lower than the voltage of C3, then C3 is discharged through the R4 branch circuit. When the difference between VB and VC increases to a specific degree, D2 will be turned on, and C3 is quickly charged through D2 and R2, so that the difference between VB and VC will not be too great. When S2 is turned on again, the potentials at points B and C are almost the same, and therefore, D2 is cut off. The voltage of C3 is higher than the voltage between points B and C, and C3 is discharged through an R3 path.

When S2 is turned off, the potential at point A(VA) =VPACK+E1, and the potential at point B(VB)=VPACK+E1+E3−V_C_Load+E4. When the difference between VB and VA is equal to E3-V_C_Load+E4, if the difference between VB and VA is greater than the forward on-state voltage of D3, D3 will be turned on. Therefore, a potential difference between points VB and VA is clamped to the forward on-state voltage of D3.

During an off state of S2, the potentials at points A and E are equal. Therefore, the potentials at C2, R3, R1, and D1 remain unchanged.

Regardless of whether S1 or S2 is turned off, the voltage regulation module HCl) is configured to stabilize the voltage between points D and E. As the VPACK voltage increases, the effect of C1 is more significant.

A person skilled in the art understands that in practical applications, the freewheeling module may also include multiple diodes or other components that serve similar functions. This embodiment does not limit the type or quantity of the components that form the freewheeling module.

A person skilled in the art understands that in practical applications, the voltage regulation module may also include multiple capacitors or other components that serve similar functions. This embodiment does not limit the type or quantity of the components that form the voltage regulation module.

A person skilled in the art understands that in practical applications, the first energy storage submodule and the second energy storage submodule each may include multiple capacitors or other components that serve similar functions. This embodiment does not limit the type or quantity of the components that form the first energy storage submodule or the second energy storage submodule.

A person skilled in the art understands that in practical applications, the first anti-reverse submodule and the second anti-reverse submodule each may include multiple diodes or other components that serve similar functions. This embodiment does not limit the type or quantity of the components that form the first anti-reverse submodule or the second anti-reverse submodule.

A person skilled in the art understands that in practical applications, the first current limiting submodule and the second current limiting submodule each may include multiple resistors or other components that serve similar functions. This embodiment does not limit the type or quantity of the components that form the first current limiting submodule or the second current limiting submodule.

A person skilled in the art understands that in practical applications, the voltage regulation module may also include multiple capacitors or other components that serve similar functions. This embodiment does not limit the type or quantity of the components that form the voltage regulation module.

A person skilled in the art understands that in practical applications, the first load submodule and the second load submodule each may include multiple resistors or other components that serve similar functions. This embodiment does not limit the type or quantity of the components that form the first load submodule or the second load submodule.

In contrast with the prior art, in the protection circuit disclosed in this embodiment, the first switch module is connected in parallel to the first protection module. When the first switch module is turned off, the first protection module switches to the charging state to absorb a spike voltage caused by the parasitic inductance, thereby avoiding excessive increase of a voltage between the first terminal of the first switch module and the second terminal of the first switch module, and reducing risks of breakdown of the first switch module. The second switch module is connected in parallel to the second protection module. When the second switch module is turned off, the second protection module switches to the charging state to absorb a spike voltage caused by the parasitic inductance, thereby avoiding excessive increase of the voltage between the first terminal of the second switch module and the second terminal of the second switch module, and reducing risks of breakdown of the second switch module. The freewheeling module is turned on when the first switch module or the second switch module is turned off, thereby stabilizing the voltage between the second terminal of the first switch module and the first terminal of the second switch module.

Figure 12:
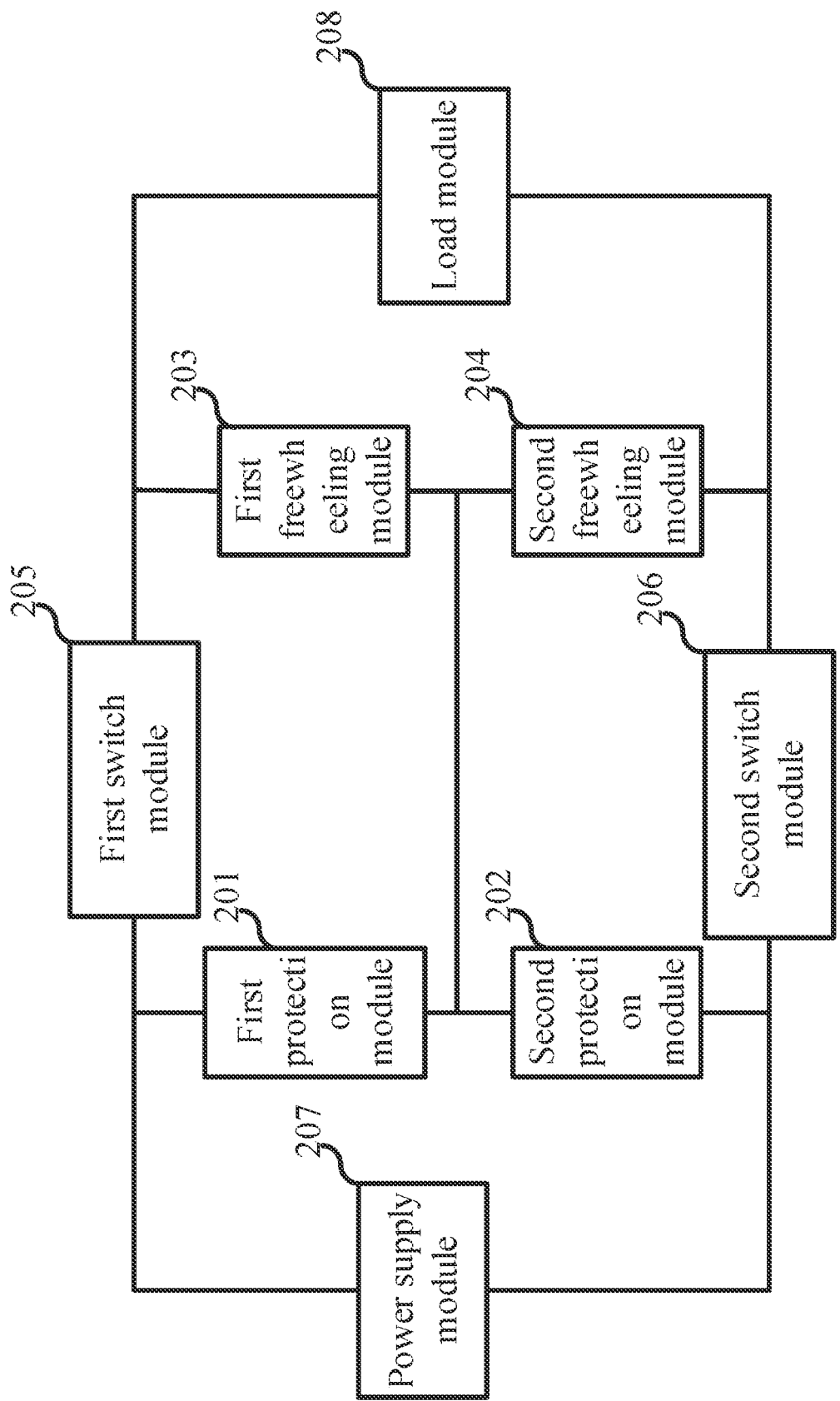
FIG. 12 is a schematic structural diagram of a protection circuit according to a third embodiment of this application.

A third embodiment of this application relates to a protection circuit, as shown in FIG. 12, including: a first protection module 201, a second protection module 202, a first freewheeling module 203, and second freewheeling module 204. A first terminal of the first protection module 201 is connected to a first terminal of a first switch module 205 in a main circuit of a BMS. A second terminal of the first protection module 201 is connected to a first terminal of the second protection module 202. A second terminal of the second protection module 202 is connected to a first terminal of a second switch module 206 in the main circuit of the BMS. A first terminal of the first freewheeling module 203 is connected to a second terminal the first switch module 205. A second terminal of the first freewheeling module 203 is connected to a first terminal of the second freewheeling module 204. A second terminal of the second freewheeling module 204 is connected to a second terminal of the second switch module 206. A node between the second terminal of the first protection module 201 and the first terminal of the second protection module 202 is connected to a node between the second terminal of the first freewheeling module 203 and the first terminal of the second freewheeling module 204. When the first switch module 205 is turned off, the first protection module 201, the first freewheeling module 203, the second freewheeling module 204, and other modules than the second switch module in the main circuit form a path to stabilize a voltage between the first terminal of the first switch module 205 and the second terminal of the first switch module, and a voltage between the first switch module 205 and the second switch module 206. When the second switch module 206 is turned off, the second protection module 202, the first freewheeling module 203, the second freewheeling module 204, and other modules than the second switch module 206 in the main circuit form a path to stabilize a voltage between the first terminal of the second switch module 206 and the second terminal of the second switch module 206, and a voltage between the first switch module 205 and the second switch module 206.

In FIG. 12, an example is described in which the main circuit includes a power supply module 207, a first switch module 205, a load module 208, and a second switch module 206, and in which the power supply module 207, the first switch module 205, the load module 208, and the second switch module 206 are serially-connected in sequence. In this case, other modules than the first switch module in the main circuit are the power supply module 207, the load module 208, and the second switch module 206; and other modules than the second switch module in the main circuit are the power supply module 207, the load module 208, and the first switch module 205. In practical applications, the main circuit may further include a third switch module serially-connected between the power supply module and the second switch module, and a drive module that is connected to control terminals of the first switch module, the second switch module, and the third switch module and that is used to control an on or off state of the first switch module, the second switch module, and the third switch module, and may further include other modules. This embodiment does not limit the specific structure of the main circuit.

Figure 13:
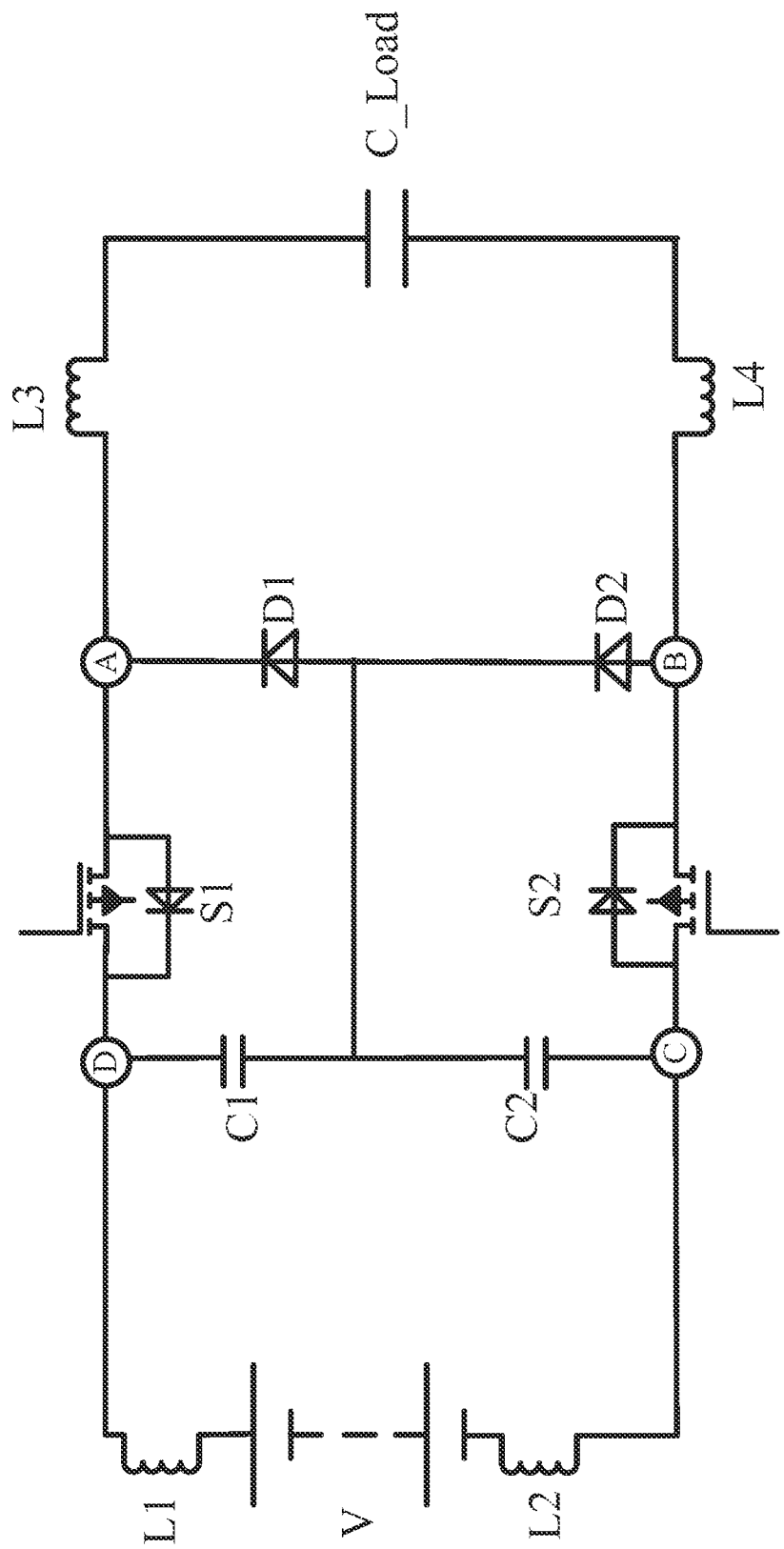
FIG. 13 is a schematic circuit diagram of a protection circuit according to a third embodiment of this application.

In an embodiment, the first protection module is a first capacitor, the first freewheeling module is a first diode, the second protection module is a second capacitor, and the second freewheeling module is a second diode. In this case, a schematic circuit diagram of the protection circuit is shown in FIG. 13, where V denotes a power supply module, L1, L2, L3, and L4 each denote a parasitic inductance in a branch circuit, S1 denotes a first switch module, the first switch module is a positive main MOSFET transistor, S2 denotes a second switch module, the second switch module is a negative main MOSFET transistor, C1 denotes a first capacitor, C2 denotes a second capacitor, D1 denotes a first diode, and D2 denotes a second diode. When S1 is turned off, C1, D1, L3, C_Load, L4, S2, L2, V, and L1 form a circuit to ensure that the voltage between the first terminal of S1 and the second terminal of S1 will not be broken down by fluctuation of a parasitic inductance. When S1 is turned on, because a branch circuit formed by C1 and C2 is connected in parallel to V, when a capacitance value of C1 is the same as a capacitance value of C2, a voltage across C1 is equal to a voltage across C2, and is equal to V/2. When S1 is turned off, due to tapering of the current in the main circuit, L1 generates an induced electromotive force E1, L2 generates an induced electromotive force E2, L3 generates an induced electromotive force E3, and L4 generates an induced electromotive force E4. Assuming that a voltage difference across the load module is VC and a forward on-state voltage of D1 and D2 is VF, then D1 and D2 are turned on when E3−VC−E4≥2VF. Due to the effect of C1, D1, and D2, the voltage difference between the node D and the node A is (V/2+VF), the voltage difference between the node B and the node D is (V/2−VF), and the voltage difference between the node A and the node B is steadily 2VF. As can be learned from the above description, C1, D1, and D2 can ensure stability of the voltage between the first terminal of S1 and the second terminal of and stability of the voltage between S1 and S2 to prevent S1 from being broken down by a too high spike voltage. Similar to the circumstance in which S1 is turned off, when S2 is turned on, the voltage across C1=the voltage across C2=V/2. Once S2 is turned off, D1 and D2 are turned on, the voltage between the node B and the node A is 2VF, and the voltage difference between the two points B and C is (V/2+VF), thereby protecting S2 from being broken down by a too high spike voltage.

To highlight an innovation part of this application, this embodiment does not describe units that are not closely related to solving the technical issues put forward in this application, which, however, shall not mean that no other units exist in this embodiment.

In contrast with the prior art, in the protection circuit disclosed in this embodiment, when the first switch module is turned off, the first protection module, the first freewheeling module, the second freewheeling module, and other modules than the first switch module in the main circuit form a path to stabilize the voltage between the first terminal of the first switch module and the second terminal of the first switch module, thereby reducing risks of breakdown of the first switch module. When the second switch module is turned off, the second protection module, the first freewheeling module, the second freewheeling module, and other modules than the second switch module in the main circuit form a path to stabilize the voltage between the first terminal of the second switch module and the second terminal of the second switch module, thereby reducing risks of breakdown of the second switch module.

A fourth embodiment of this application relates to a protection circuit. This embodiment is a further improvement based on the third embodiment. The specific improvement is: in this embodiment, the protection circuit further includes a voltage regulation module, a first current limiting module, a second current limiting module, and a discharging module.

Figure 14:
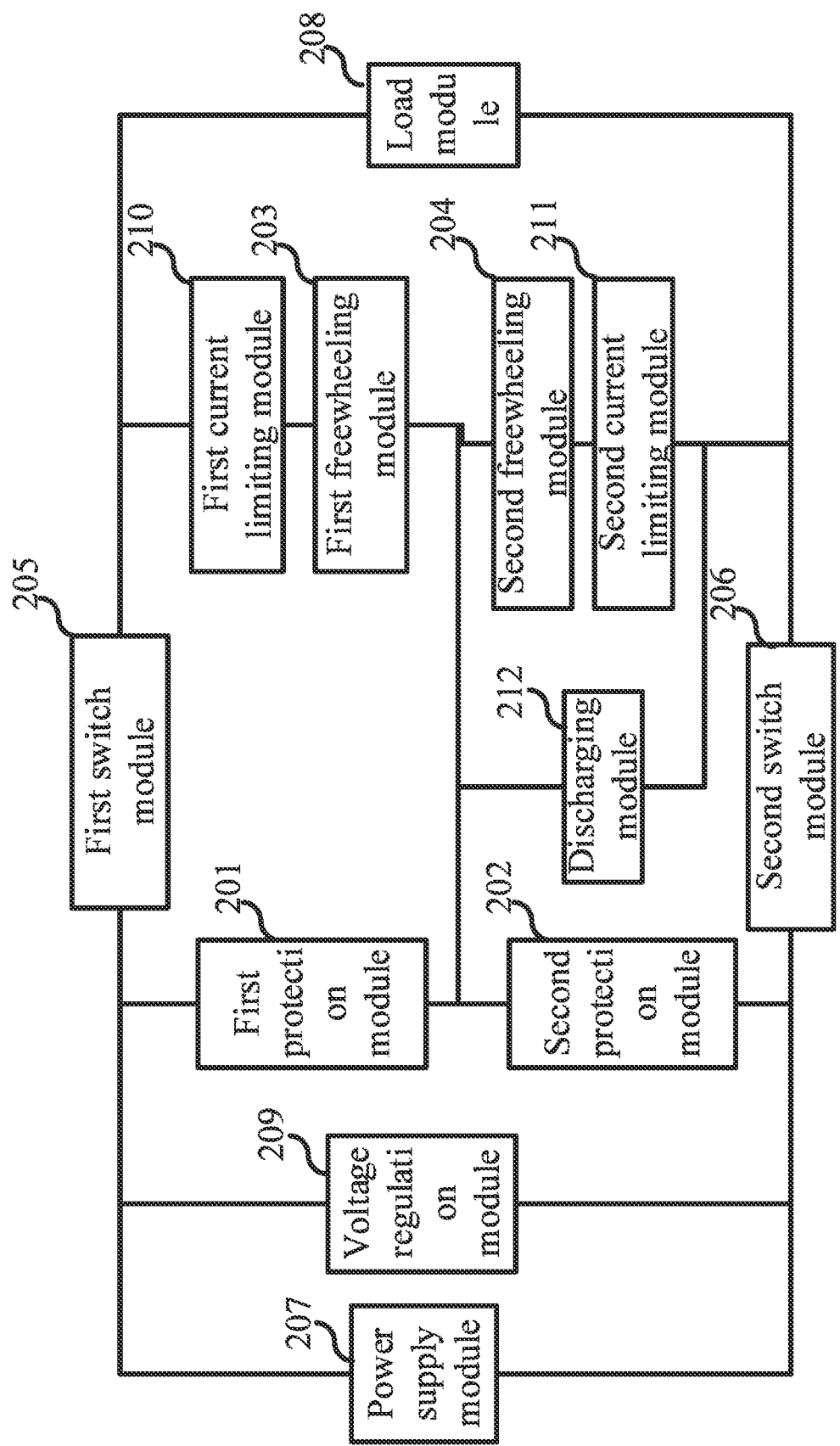
FIG. 14 is a schematic structural diagram of a protection circuit according to a fourth embodiment of this application.

Specifically, as shown in FIG. 14, the protection circuit further includes a voltage regulation module 209. The voltage regulation module 209 is connected in parallel to a power supply module 207 of a BMS to stabilize a voltage between a first switch module 205 and a second switch module 206, or to stabilize a voltage between a third switch module and the first switch module 205 in a main circuit of the BMS. The protection circuit further includes a first current limiting module 210 and a second current limiting module 211. The first current limiting module 210 is serially-connected to a first freewheeling module 203. The second current limiting module 211 is serially-connected to a second freewheeling module 204, The first current limiting module 210 is configured to stabilize a current of the main circuit when the first switch module 205 is turned off. The second current limiting module 211 is configured to stabilize the current of the main circuit when the second switch module 206 is turned off. The protection circuit further includes a discharging module 212. A first terminal of the discharging module 212 is connected to a node between the second terminal of the first protection module 201 and the first terminal of the second protection module 202. A second terminal of the discharging module 212 is connected to the second terminal of the second current limiting module 211. The first protection module and the second protection module perform discharging through the discharging module.

Figure 15:
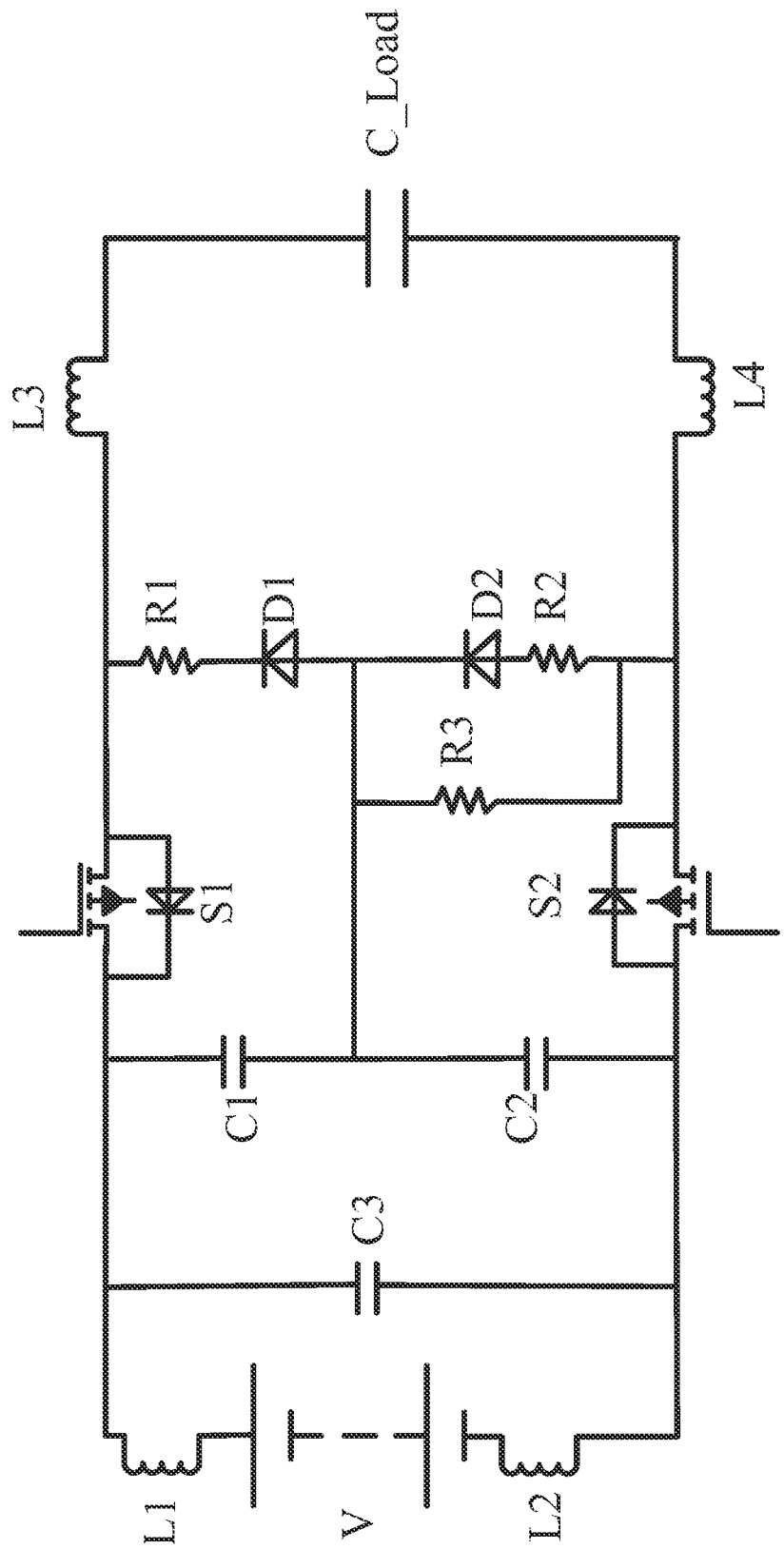
FIG. 15 is a schematic circuit diagram of a protection circuit according to a fourth embodiment of this application.

In an embodiment, the voltage regulation module is a third capacitor C3), the first current limiting module is a first resistor (R1), the second current limiting module is a second resistor (R2), and the discharging module is a third resistor (R3). In this case, a circuit diagram of the protection circuit is shown in FIG. 15.

By adding the voltage regulation module in the protection circuit, the voltage between the node B and the node D can be further stabilized, and the impact caused by a spike voltage onto the first switch module can be further mitigated.

The first current limiting module is serially-connected to the first freewheeling module, and the second current limiting module is serially-connected to the second freewheeling module to avoid overcurrent in the main circuit.

Figure 16:
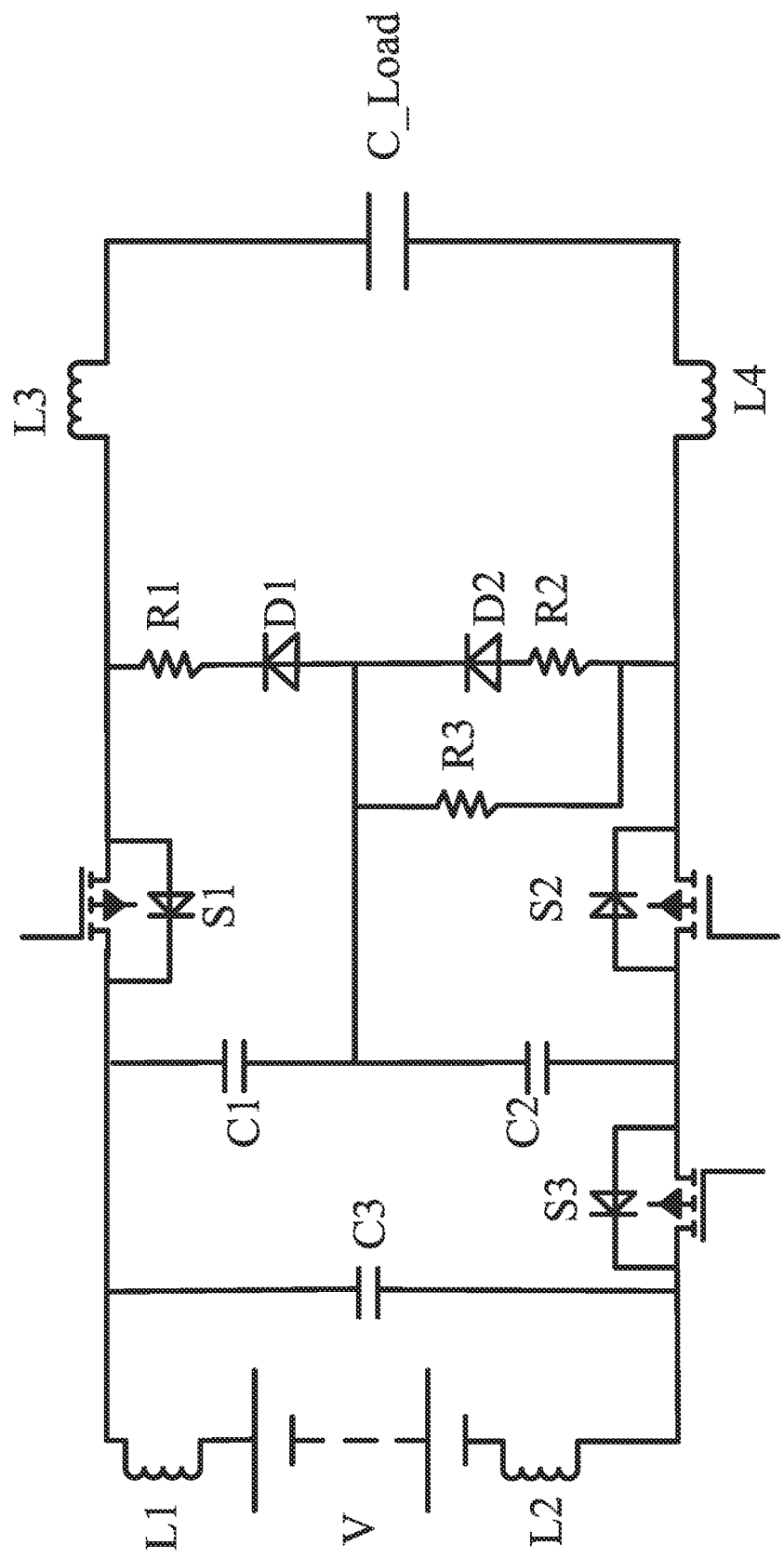
FIG. 16 is a schematic circuit diagram of another protection circuit according to a fourth embodiment of this application.

In an embodiment, the main circuit further includes a third switch module (S3). In this case, the schematic circuit diagram of the protection circuit and the main circuit is shown in FIG. 16. In this case, the working principles of the protection circuit are similar to those of the protection circuit mentioned in the third embodiment, and details are omitted here.

A person skilled in the art understands that in practical applications, the voltage regulation module, the first current limiting module, the second current limiting module, and the discharging module may be selectively added, or any one or more of the voltage regulation module, the first current limiting module, the second current limiting module, or the discharging module may be selectively added.

In contrast with the prior art, in the protection circuit disclosed in this embodiment, when the first switch module is turned off, the first protection module, the first freewheeling module, the second freewheeling module, and other modules than the first switch module in the main circuit form a path to stabilize the voltage between the first terminal of the first switch module and the second terminal of the first switch module, thereby reducing risks of breakdown of the first switch module. When the second switch module is turned off, the second protection module, the first freewheeling module, the second freewheeling module, and other modules than the second switch module in the main circuit form a path to stabilize the voltage between the first terminal of the second switch module and the second terminal of the second switch module, thereby reducing risks of breakdown of the second switch module. In addition, the voltage regulation module added in the protection circuit further stabilizes the voltage between the node B and the node D, and further mitigates the impact caused by the spike voltage onto the first switch module. The first current limiting module is serially-connected to the first freewheeling module, and the second current limiting module is serially-connected to the second freewheeling module to avoid overcurrent in the main circuit.

A person skilled in the art understands that parameter values of each module in the protection circuit mentioned in the first embodiment to the fourth embodiment may be set according to parameter values of each module of a BMS, and are not enumerated here in detail.

A fifth embodiment of this application relates to a BMS, including: a main circuit and the protection circuit 62 mentioned in the above embodiment. The main circuit includes a power supply module 611, a first switch module 612, a load module 613, and a second switch module 614; and the power supply module 611, the first switch module 612, the load module 613, and the second switch module 614 are serially-connected in sequence.

Figure 17:
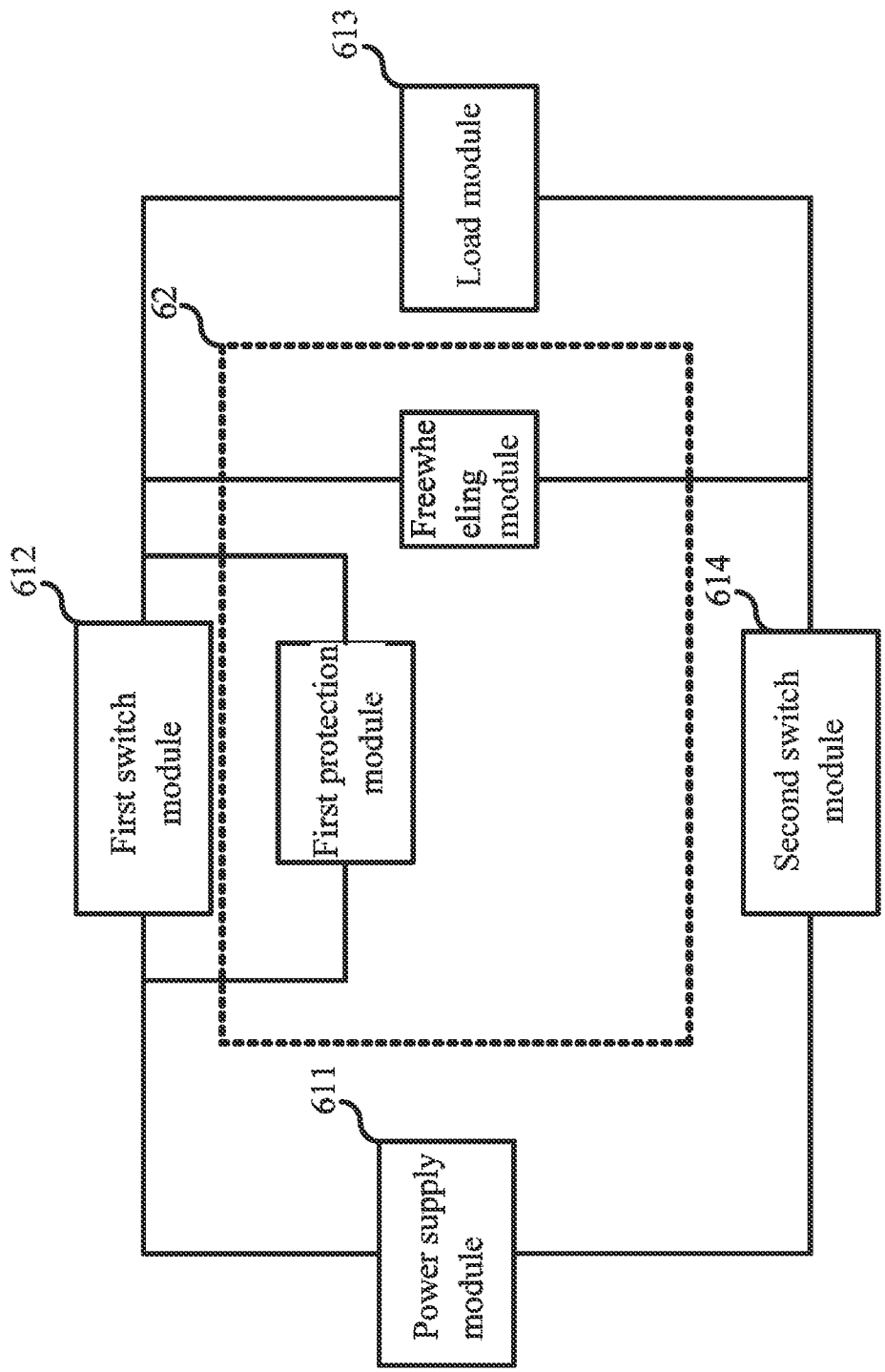
FIG. 17 is a schematic structural diagram of a BMS according to a fifth embodiment of this application.

In an embodiment, when the BMS uses the protection circuit mentioned in the first embodiment or the second embodiment, a schematic structural diagram of the BMS is shown in FIG. 17.

Figure 18:
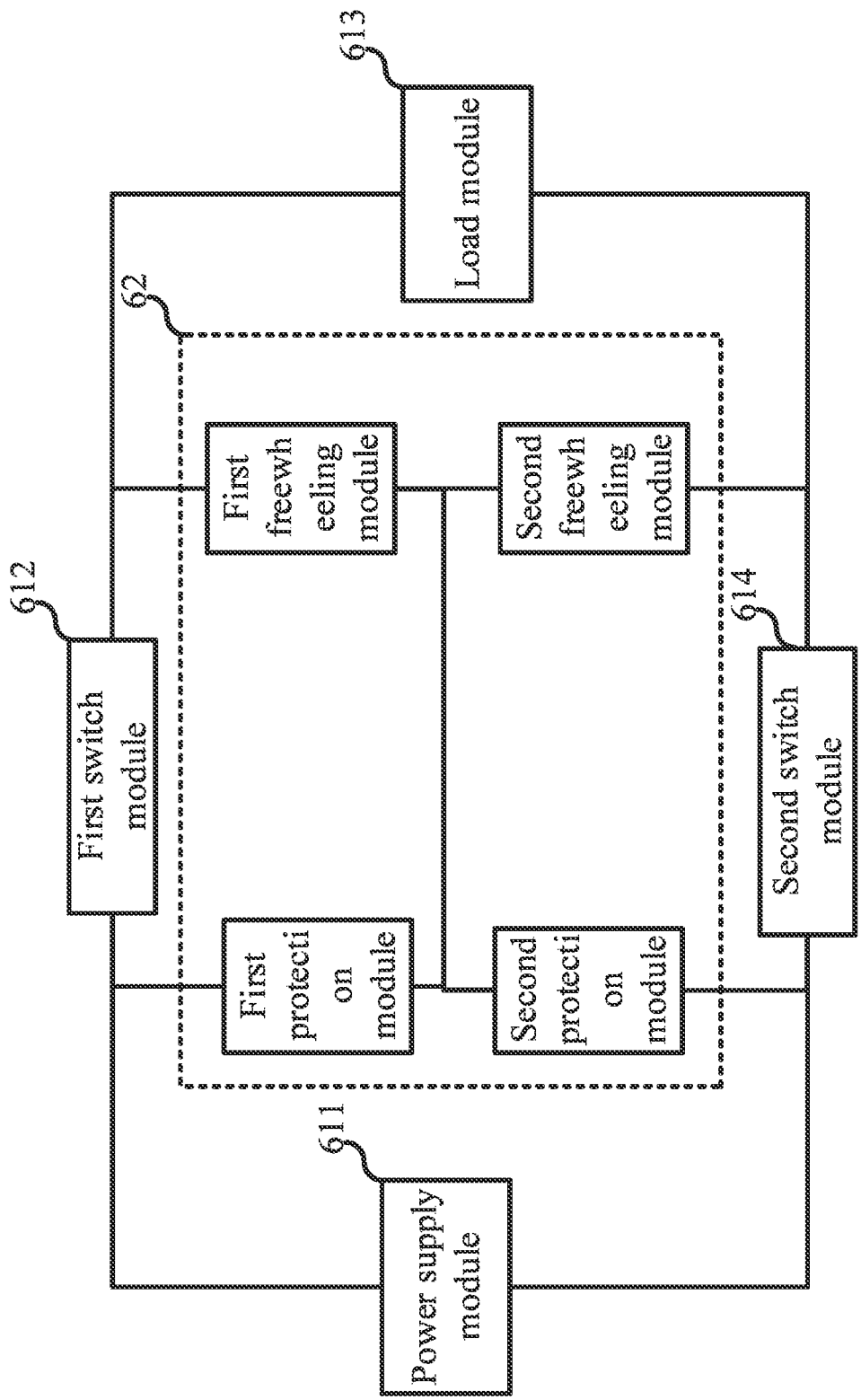
FIG. 18 is a schematic structural diagram of a BMS according to a fifth embodiment of this application.

In an embodiment, when the BMS uses the protection circuit mentioned in the third embodiment or the fourth embodiment, a schematic structural diagram of the BMS is shown in FIG. 18.

A person skilled in the art understands that FIG. 17 and FIG. 18 are merely exemplary illustrations. In practical applications, the protection circuit 62 may be another module such as a voltage regulation module. This embodiment does not limit the specific structure of the protection circuit.

Apparently, this embodiment is an embodiment corresponding to the first embodiment, the second embodiment, the third embodiment, and the fourth embodiment. This embodiment may be used together with the first embodiment, the second embodiment, the third embodiment, and the fourth embodiment. The relevant technical details mentioned in the first embodiment, the second embodiment, the third embodiment, and the fourth embodiment are still applicable to this embodiment. For brevity, details are omitted here. Correspondingly, the technical details mentioned in this embodiment are also applicable to the first embodiment, the second embodiment, the third embodiment, and the fourth embodiment.

A person of ordinary skill in the art understands that the embodiments described above are exemplary embodiments for implementing this application. In practical applications, various modifications may be made in form and detail to the embodiments without departing from the spirit and scope of this application.

What is claimed is:

1. A protection circuit, comprising a first protection module and a freewheeling module, wherein the first protection module is connected in parallel to a first switch module in a main circuit of a battery management system, the freewheeling module is connected in parallel to a load module in the main circuit of the battery management system, the first switch module, the load module, and a second switch module in the main circuit of the battery management system are serially-connected, and the first switch module is a switching transistor;
the first protection module is configured to switch the first protection module to a charging state when the first switch module is turned off, so as to stabilize a voltage between a first terminal of the first switch module and a second terminal of the first switch module; and
the freewheeling module is configured to switch on when the first switch module is turned off, so as to stabilize a voltage between the first switch module and the second switch module in the main circuit of the battery management system.

2. The protection circuit according to claim 1, wherein the second switch module is a switching transistor, and the protection circuit further comprises a second protection module, and the second protection module is connected in parallel to the second switch module;
the second protection module is configured to switch to a charging state when the second switch module is turned off, so as to stabilize a voltage between a first terminal of the second switch module and a second terminal of the second switch module; and
the freewheeling module is configured to switch on when the second switch module is turned off, so as to stabilize the voltage between the first switch module and the second switch module.

3. The protection circuit according to claim 2, wherein the second protection module comprises a second energy storage submodule and a second anti-reverse submodule, and the second energy storage submodule is serially-connected to the second anti-reverse submodule; and
the second anti-reverse submodule is configured to switch on when the voltage between the first terminal of the second switch module and the second terminal of the second switch module is greater than a second preset value, so that the second energy storage submodule stores a spike voltage that occurs when the second switch module is turned off.

4. The protection circuit according to claim 3, wherein the second energy storage submodule is a third capacitor, and the second anti-reverse submodule is a second diode.

5. The protection circuit according to claim 3, wherein the second protection module further comprises a second current limiting submodule; the second current limiting submodule, the second energy storage submodule, and the second anti-reverse submodule are serially-connected, and the second current limiting submodule is configured to stabilize a current of the main circuit when the second anti-reverse submodule is turned on.

6. The protection circuit according to claim 5, wherein the second current limiting submodule is a second resistor.

7. The protection circuit according to claim 3, wherein the second protection module further comprises a second load submodule that is connected in parallel to the second anti-reverse submodule, and the second energy storage submodule is configured to perform charging or discharging through the second load submodule.

8. The protection circuit according to claim 7, wherein the second load submodule is a fourth resistor.

9. The protection circuit according to claim 1, wherein the protection circuit further comprises a voltage regulation module that is connected in parallel to a power supply module in the main circuit of the battery management system to stabilize the voltage between the first switch module and the second switch module, or to stabilize a voltage between a third switch module and the second switch module in the main circuit of the battery management system.

10. The protection circuit according to claim 9, wherein the voltage regulation module comprises a first capacitor.

11. The protection circuit according to claim 1, wherein the first protection module comprises a first energy storage submodule and a first anti-reverse submodule, and the first energy storage submodule is serially-connected to the first anti-reverse submodule; and
the first anti-reverse submodule is configured to switch on when the voltage between the first terminal of the first switch module and the second terminal of the first switch module is greater than a first preset value, so that the first energy storage submodule stores a spike voltage that occurs when the first switch module is turned off.

12. The protection circuit according to claim 11, wherein the first energy storage submodule is a second capacitor, and the first anti-reverse submodule is a first diode.

13. The protection circuit according to claim 11, wherein the first protection module further comprises a first current limiting submodule; the first current limiting submodule, the first energy storage submodule, and the first anti-reverse submodule are serially-connected, and the first current limiting submodule is configured to stabilize a current of the main circuit when the first anti-reverse submodule is turned on.

14. The protection circuit according to claim 13, wherein the first current limiting submodule is a first resistor.

15. The protection circuit according to claim 11, wherein the first protection module further comprises a first load submodule; the first load submodule is connected in parallel to the first anti-reverse submodule, and the first energy storage submodule is configured to perform charging or discharging through the first load submodule.

16. The protection circuit according to claim 15, wherein the first load submodule is a third resistor.

17. The protection circuit according to claim 1, wherein the protection circuit further comprises a drive module and a detection module;
the detection module is configured to detect whether the first switch module and the second switch module are in a normal working state; and
the drive module is configured to drive the first switch module and the second switch module according to a detection result of the detection module.

18. A battery management system, comprising: a main circuit, wherein the main circuit comprises a power supply module, a first switch module, a load module, and a second switch module; and the power supply module, the first switch module, the load module, and the second switch module are serially-connected; and a protection circuit, wherein the protection circuit comprises a first protection module and a freewheeling module, the first protection module is connected in parallel to the first switch module in the main circuit of the battery management system, the freewheeling module is connected in parallel to the load module in the main circuit of the battery management system, and the first switch module is a switching transistor, wherein:

the first protection module is configured to switch the first protection module to a charging state when the first switch module is turned off, so as to stabilize a voltage between a first terminal of the first switch module and a second terminal of the first switch module; and the freewheeling module is configured to switch on when the first switch module is turned off, so as to stabilize a voltage between the first switch module and the second switch module in the main circuit of the battery management system.

\* \* \* \* \*